United States Patent [19]
Haas

[11] Patent Number: 5,321,350
[45] Date of Patent: Jun. 14, 1994

[54] FUNDAMENTAL FREQUENCY AND PERIOD DETECTOR

[76] Inventor: Peter Haas, R.D. 1, #960, East Fairfield, Vt. 05448

[21] Appl. No.: 932,928

[22] Filed: Aug. 20, 1992

Related U.S. Application Data

[63] Continuation of Ser. No. 319,752, Mar. 7, 1989, abandoned.

[51] Int. Cl.⁵ ............................................. G01R 23/16
[52] U.S. Cl. .................................. 324/76.11; 364/484
[58] Field of Search ................. 324/77 R, 77 B, 77 E, 324/79 R; 364/569, 484, 485, 486, 487

[56] References Cited

U.S. PATENT DOCUMENTS

| | | | |
|---|---|---|---|
| 4,202,237 | 5/1980 | Hakansson | 84/1.24 |
| 4,319,329 | 3/1982 | Girgis et al. | 364/484 |
| 4,377,961 | 3/1983 | Bode | 324/77 E |
| 4,457,203 | 7/1984 | Schoenberg et al. | 324/79 D |
| 4,644,268 | 2/1987 | Malka et al. | 324/83 R |
| 4,678,987 | 7/1987 | Bauk | 324/77 B |
| 4,771,671 | 9/1988 | Hoff, Jr. | 84/1.01 |

OTHER PUBLICATIONS

"Musical Applications of Microprocessors" by Hal Chamberlin 1985 pub. Hayden Book Company 9 pages (month of publication unknown).
"Digital Processing of Speech Signals", by Rabiner, L. R. 1978 pub. by Prentice-Hall Internation, Inc., London pp. 135-143 (month unknown).
"BYTE" Dec. 1989 p. 266.

Primary Examiner—Louis Arana
Attorney, Agent, or Firm—David Fink

[57] ABSTRACT

Fundamental frequency and period detector processes and systems which determine the end of a cycle of an ac waveform by using the characteristic of the integral of a single cycle of an ac waveform that the value of the integral at the end of the cycle is the same as at the cycle start despite cycle noise, multiple zero crossings and other cycle obscuration. These processes and systems use the cycle integral to self-synchronize with each cycle of an ac waveform. Formation of the cycle integral of each processed cycle is a useful by-product of the frequency and period detection processes and systems.

95 Claims, 10 Drawing Sheets

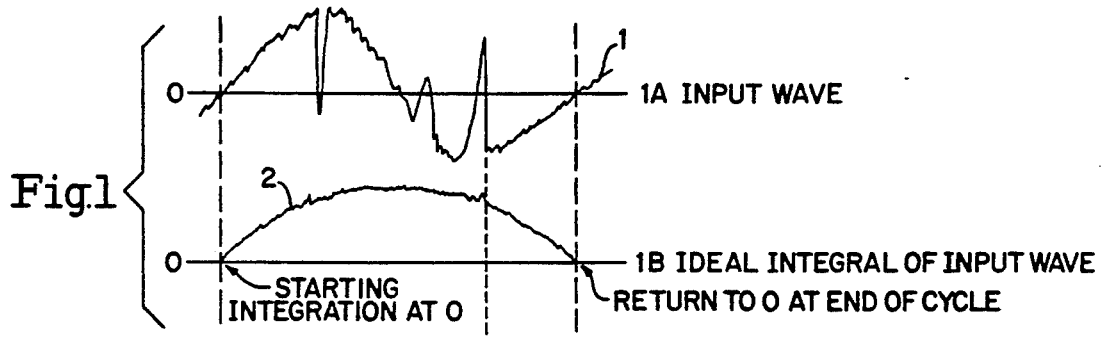
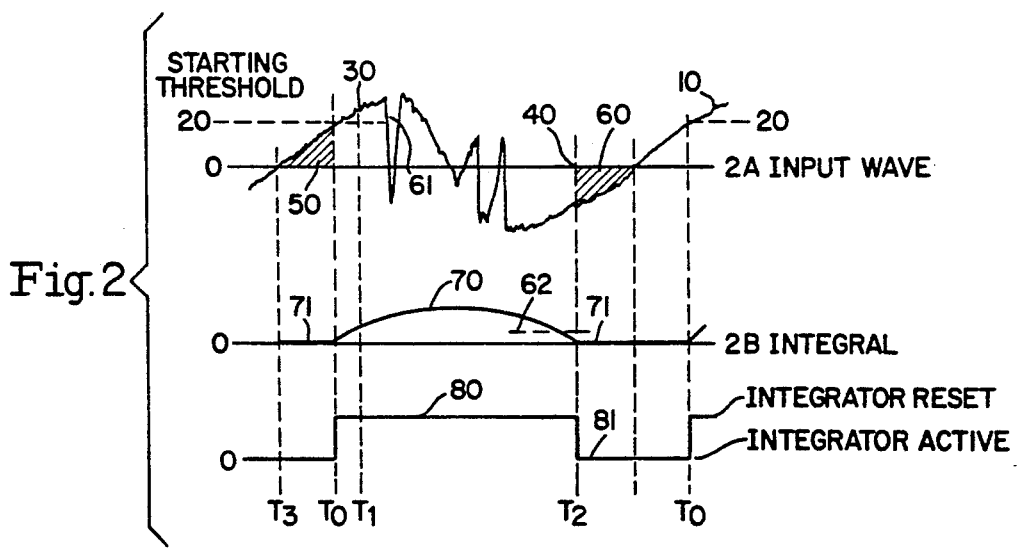

FUNDAMENTAL FREQUENCY AND PERIOD DETECTOR

CROSS-REFERENCE TO RELATED APPLICATION

This application is a continuation of prior application Ser. No. 07/319,752 filed Mar. 7, 1989, now abandoned.

BACKGROUND OF THE INVENTION

1. Field of the Invention

This invention relates to the detection of the fundamental frequency of an alternating current input wave and to audio synthesizer systems which utilize the fundamental frequencies of audio waves and, more particularly, to the detection of fundamental frequencies in real time, especially for realistically synthesizing audio frequencies.

2. Description of the Related Art

The detection of the basic or fundamental frequency of a wave, often called f0, is of importance in many fields including metrology, radio, television, radar, sonar, telephony, many types of scientific and medical instrumentation and electronic music. Determination of the single cycle integral of a wave in real time also has uses in many of these and other application areas.

Determination of the fundamental frequency (f0) of a wave which has been obscured by high harmonic content or noise has been solved for some cases by various means known to the art. Despite this, certain waveforms, including those generated by the human voice, have defied all attempts until now to determine f0 in real time. By real time is meant on a cycle by cycle basis, with the duration of each cycle becoming known at essentially the moment of its ending. None of the following related prior art solves the problem of detecting the fundamental frequency in real time.

Malka U.S. Pat. No. 4,644,268 issued Feb. 17, 1987 for Apparatus and Method for Determining the Magnitude and Phase of the Fundamental Component of a Complex Waveshape. Malka discloses a method for "Determining the Magnitude and Phase of the Fundamental Component of a Complex Waveshape" with respect to a reference wave. Malka assumes that the amplitude of the input wave changes slowly so that digital computer means, having sampled the wave, can adjust amplifier means to bring it into a usable measurement range. It is assumed it will stay there for subsequent measurement. The input wave is then digitized, with the first digitized sample timed from the zero crossing of the reference wave. Fast Fourier Analysis and other computer means are then used to calculate the magnitude of the input wave and its phase difference from the reference wave. Very useful for calculating the angular position of resolvers and other devices which shift the phase of a reference proportional to some physical variable.

Schoenberg U.S. Pat. No. 4,457,203 issued Jul. 3, 1984 for Sound Signal Automatic Detection and Display Method and System. Schoenberg discloses a method for determining frequency based upon the assumption that an input wave has only one positive and one negative peak per cycle. Automatic Gain Control and variable frequency lowpass filter means are applied to the incoming wave so that the cycle detection criteria may (hopefully) be satisfied. During AGC and filter cutoff point adjustment, cycles may be "lost". Subsequent computer means compensate for this loss by application of statistical methods to the series of measurement values to determine input frequency and display same.

Girgis U.S. Pat. No. 4,319,329 issued Mar. 7, 1982 for Frequency Measuring and Monitoring Apparatus, Methods and Systems. Girgis discloses a frequency measurement method based on the assumption of a single positive going axis crossing per cycle from a "cleaned up" filtered waveform. The cycle is digitized and the use of a variant of the Fast Fourier Transform method calculates precise and relatively small deviations from a known frequency, the known frequency having previously been used to calibrate the system.

Katterfeld U.S. Pat. No. 4,161,625 issued Jul. 17, 1979 for Method for Determining the Fundamental Frequency of a Voice Signal. Katterfeld discloses an enhancement of the autocorrelation technique. This technique is based upon the supposition that sequential cycles of a complex wave will vary little from one to the next. Thus, by taking a time "windowed" sample of the wave and continuously comparing it to the incoming wave, it may be expected that a "match", or very close, correlation between sample and incoming wave will be found one cycle later. The process requires continuous sampling and comparing.

Some of the approaches taken by the field of speech recognition are disclosed in Digital Processing of Speech Signals, by Rabiner & Schafer, Prentiss-Hall 1978. Disclosed are several techniques for finding fundamental frequency: estimations based on zero crossings, autocorrelation and short term average magnitude difference function (a variant on autocorrelation, see Katterfeld above). The authors conclude (at p. 135): "All of the proposed schemes have their limitations and it is safe to say that no presently available pitch detection scheme can be expected to give perfectly satisfactory results across a wide range of speakers, applications and operating environments."

Some of the approaches taken in the field of electronic music are disclosed in Musical Applications of Microprocessors, by Hal Chamberlin, Second Edition, Hayden Book Company, 1985. A survey of pitch detector schemes is disclosed including all those in the Rabiner & Schafer book and the above referenced patents. A series of "troublesome waveforms for pitch detectors" is presented, one or more of which will cause every scheme to fail. The conclusion (at p. 578) is that there is an "abundance of pitch detection schemes covering a wide range of complexity and performance levels. Even so, it is safe to say that none of them is completely satisfactory, that is, agree with a human observer in all cases."

SUMMARY OF INVENTION

The general object of the invention is to solve the problem of detecting the fundamental frequency of an alternating current input wave in real time.

A specific object of the invention is to detect the fundamental frequency of a human voice in real time.

Another object of the invention is to detect fundamental frequency (f0) on a real time cycle by cycle basis despite severe input obscuration by noise or harmonics, multiple zero crossings per cycle and rapid changes in amplitude from cycle to cycle.

Another object of the invention is to generate the full cycle integral of each cycle.

A further object of the invention is to provide a real time frequency synthesizer.

A still further object of the invention is to provide both a real time frequency synthesizer and an amplitude modulator.

Briefly, in accordance with the invention, these and other objects are attained by a process for detecting the fundamental frequency of a cycle of an alternating current input wave comprising the steps of:

(A) starting to integrate the amplitudes of the input wave when the amplitude of the input wave exceeds a given amplitude in a given polarity;

(B) continuing to integrate the amplitudes of the input wave for a first given period of time which is less than the shortest expected wave period being detected and during the first period of time ignoring the value of the integral;

(C) continuing to integrate the amplitudes of the input wave for a second period of time until the value of the integral is insubstantially different from its value when the integration started;

(D) resetting the value of the integral prior to the input wave again reaching the given amplitude in the given polarity; and (E) repeating steps (A) through (D) for a plurality of cycles;

(F) whereby the time between any given point in the steps (A)–(D) for the current cycle and the corresponding point in the steps (A)–(D) for the succeeding cycle represents the detected period of the fundamental frequency.

In accordance with another embodiment of the invention step (C) comprises continuing to integrate the amplitudes of the input wave for a second period of time until the value of the integral reaches a threshold voltage set between the reset value of the integral and the minimum expected value of the integral.

In accordance with an embodiment of the invention for synthesizing multiples of the fundamental frequency of an alternating current input wave, the following steps are performed: detecting the fundamental frequency of a cycle of an alternating current input wave according to the above process and creating one or more alternating current waveforms at multiples of the detected fundamental frequency of the input wave.

An advantage of the invention is that the detected fundamental frequency and the full cycle integral may be used to control the frequency synthesizer and amplitude modulator of the synthesized frequency, respectively. The resulting synthesized output is an amplitude modulated wave whose frequency is controlled by the measured f0 and whose amplitude is a function of the measured integral.

Subsystems comprised of analyzer/synthesizers, related computer interfaces and other interfaces are also disclosed and claimed herein.

BASIC PRINCIPLE OF THE ANALYZER

These embodiments, features and advantages of the invention will be preliminarily explained by referring to the waveforms in the accompanying FIGS. 1 and 2, which show the basic principle underlying the fundamental frequency analyzer portion of the invention.

The invention takes advantage of the fact that an alternating current (ac) waveform must have an integral of zero over each cycle; that is, the areas under the positive portions of the curve must equal the areas bounded by the negative portions for each cycle. FIGS. 1A and 1B illustrate this principle. Note that in FIG. 1B, if the integral is started from zero when the input of FIG. 1A is also at zero, the integral will return to zero at the end of the input cycle. Multiple zero crossings, noise, etc. do not affect this characteristic of the integral. Recognition that the integral could be used in this way was a critical part of the inventive process. However, in order to take advantage of it, the following problems had to be solved:

1. When to start the integration process on an input waveform and,

2. How to deal with the fact that there is no such thing as a perfect integrator; real integrators will not come back to their exact starting point at the end of each cycle and any error will accumulate with every cycle.

A process which solves those problems in accordance with the invention is illustrated in FIG. 2. This process shows how to detect the fundamental frequency of an input wave; that is, perform a process on the input wave such that the interaction of the process and the input wave will lock the process timing to that of the input wave, whereby the process is said to have detected the input wave.

More particularly, the process for detecting the fundamental frequency of a cycle of an alternating current input wave in accordance with the brief summary of the invention referred to above is comprised of the steps of (FIG. 2):

(A) starting to integrate the amplitudes of the input wave when the amplitude of the input wave exceeds a given amplitude in a given polarity, as at 20;

(B) continuing to integrate the amplitudes of the input wave for a first given period of time (from 20 to 30) which is less than the shortest expected wave period being detected and during said first period of time ignoring the value of the integral 70;

(C) continuing to integrate the amplitudes of the input wave for a second period of time (from 30 to 40) until the value of the integral 70 is insubstantially different from its value 71 when the integration started (which will be prior to the end of cycle as a result of the process thus far), whereupon;

(D) the value of the integral is reset to 71 prior to the input wave again reaching said given amplitude in said given polarity, as at 20;

(E) again starting to integrate the amplitudes of the input wave when the amplitude of the input wave exceeds said given amplitude in said given polarity, 20, which action is the start of a repetition of process steps (A) through (D);

(F) whereby the time between any specifiable point in the process for the current cycle and the corresponding point in the process for the succeeding cycle represents the detected period of the fundamental frequency.

In the above process the phrase "insubstantially different" recognizes that there is no such thing as a perfect comparator, but that very good comparators do exist which can recognize when two inputs are "insubstantially different".

Also, since integration started just after the beginning of the cycle, it must end just before the end of the cycle. This is because area 50 is not integrated; areas 50 and 60 must be equal; event 20 was just after the start of the cycle, and thus event 40 must be just before the end of the cycle.

Further, since the integral must return to zero before the end of cycle, the remaining portion of the cycle bounding area 60 will assuredly drive the integral past its reset value, guaranteeing that a comparator will detect it. That is, the "insubstantially different from its value when the integration started" process step will assuredly be achieved.

Waveform 80/81 shows the timing when the integrator is active and when the integrator reset, respectively. This waveform is clearly responsive to detection of a level 20 and detection of return of the integral to its value which is "insubstantially different from its value when the integration started" 40.

This waveform 80/81 illustrates use of the detection criteria of the process, paragraph (F) above. For example:

a. The time between start of integration in the process for the current cycle and the corresponding point in the process for the succeeding cycle represents the detected period of the fundamental frequency, or b. The time between when the amplitude of the input wave exceeds a given amplitude in a given polarity in the process for the current cycle and the corresponding point in the process for the succeeding cycle represents the detected period of the fundamental frequency, or c. The time between the end of integration in the process for the current cycle and the corresponding point in the process for the succeeding cycle represents the detected period of the fundamental frequency.

Another feature of the invention is t generate pulses having a repetition rate equal to the fundamental frequency of the alternating current input wave by:

(A) detection of the period of the fundamental frequency as described above:

(B) generating a pulse at any specifiable point in the process for the current cycle and the corresponding point in the process for the succeeding cycle;

(C) whereby the pulse repetition rate of said generated pulses is equal to the fundamental frequency of the input wave.

Another feature of the invention is to quantify the fundamental frequency of a cycle of an alternating current input wave by the steps of:

(A) detection of the period of the fundamental frequency as described above;

(B) measuring the time between any specifiable point in the process for the current cycle and the corresponding point in the process for the succeeding cycle;

(C) whereby the measured time is equal to the period of the fundamental frequency of the cycle of the input wave.

In accord with a further feature of the invention, the time between specifiable points is measured by counting the number of oscillations of an oscillator between corresponding points, with the oscillator frequency substantially higher than the highest expected detected fundamental frequency and multiplying such count by the oscillator period to obtain the period of the fundamental frequency of the input wave.

In order to give the process for f0 detection the largest possible input dynamic range, it would be desirable to set the starting threshold 20 at just greater than the channel noise of the input channel. This desirable feature is in conflict with the requirement that area 50 be large enough so that, even with integrator errors, area 60 will still exist and event 40 will be before the end of cycle. Unfortunately, as threshold 20 is reduced, areas 50 and 60 become smaller and smaller and area 60 could in fact disappear entirely, due to integrator errors. If that happened, then the process requirement that the integral return to a value "insubstantially different from its value when the integration started" might never be satisfied and the process could fail.

Pursuant to the invention, there are four techniques which permit process starting threshold 20 to be set where wanted and still use the integral to locate a time before the end of the cycle. They are:

(1) The integral will, prior to the end of the cycle being detected, return to said value which is insubstantially different from the value it had when integration started because of the addition to the input wave of a small amount of voltage of a polarity opposite that of said given polarity. The addition of such a voltage will obviously increase area 60, even if area 50 is very close to zero.

(2) A related technique to is to take the integral with respect to a level other than zero. For example, if the integral is taken with respect to the threshold level 20, then the area of the waveform above that level will always be less than the area below it and if the difference is greater than the sum of all errors, the integral will return to its starting point assuredly before the end of cycle.

(3) Another technique is to only add a bias opposite the input starting polarity at such times as the input is also opposite to the process starting polarity. This has the advantage of not letting the integral be delayed in the start of a substantial accumulation by initial biasing subtractions. This approach could be advantageously used especially in the analog domain at very high frequencies and low input amplitudes.

(4) A threshold can be set, as at 62. FIG. 2. To use this threshold, the basic f0 detection process is modified to be:

(a) starting to integrate the amplitudes of the input wave when the amplitude of the input wave exceeds a given amplitude in a given polarity;

(b) continuing to integrate the amplitudes of the input wave for a first given period of time which is less than the shortest expected wave period being detected and during said first period of time ignoring the value of the integral;

(c) continuing to integrate the amplitudes of the input wave for a second period of time until the value of the integral reaches a threshold voltage 62 set above the highest expected end of cycle value of the integral (which will be prior to the end of cycle as a result of the process thus far), whereupon;

(d) the value of the integral is reset prior to the input wave again reaching said given amplitude;

(e) again starting to integrate the amplitudes of the input wave when the amplitude of the input wave exceeds said given amplitude in said given polarity, which action is the start of a repetition of process steps (a) through (d);

(f) whereby the time between any specifiable point in the process for the current cycle and the corresponding point in the process for the succeeding cycle represents the detected period of the fundamental frequency.

The above four techniques are not exhaustive; various others, combinations and permutations will suggest themselves to those skilled in the art. Each has its advantages and disadvantages.

A aspect of the above process is that the detected f0 requires both a "current cycle" and a "succeeding cycle". However, in a series of cycles, eventually we come to the last cycle, which, by definition, has no "succeeding cycle". There will be a specifiable event in the last cycle, from which we may begin to measure the period of it. But since there is no cycle following, the cycle will seem to never end.

To solve the preceding problem, in accordance with another feature of the invention, the f0 detection process is supplemented by the additional step of sensing if the source of the alternating current input wave has no signal present with an amplitude in excess of channel noise for some minimum period of time, and determination of the existence of such a condition is used to terminate the fundamental frequency detection process.

Furthermore, detection of such a condition may also be made available for use by other processes incorporating the f0 detection process as a subprocess.

The last cycle also can be determined pursuant to another feature of the invention. Noting each time the input wave reaches zero and using the time of last occurrence prior to "no-signal" detection will give a reasonable measure of the cycle true endpoint. The last cycle can also be determined, if digital computer means are employed to implement the f0 detection process, by storing the time of zero crossing just before event 20 and measuring to the final time the input comes to rest at zero, with a "no-signal" condition.

In fact, an even more accurate measure of f0 can be obtained by measuring the times between last zero crossing prior to successive event 20's.

In addition to determining the f0 of the input wave, in accordance with the invention the process also develops the integral of each cycle. The peak value of the integral is a useful thing to know and the process can be supplemented by the further step of storing the peak value of the integral of the input wave for each cycle. This is readily accomplished using common elements of the art: peak detection, storage at end of cycle and reset of peak detection after storage, in anticipation of the next peak. Event 40 is, for example, a convenient point to take as end of cycle in this context.

Further, the peak amplitudes (plus and minus) of the input wave itself may be usefully stored. Because the detection process provides the required timing, this is readily accomplished using common elements of the art: peak detection, storage at end of cycle and reset of peak detection after storage, in anticipation of the next peak. Event 40 is, for example, a convenient point to take as end of cycle, in this context.

An especially important advantage of the f0 detection process is that it is self-aligning. To see how this works, assume the process was incorrectly started at 61. This would be equivalent to increasing the size of areas 50 and 60, so that integration would end earlier than at 40. The process would then correctly restart at the following 20.

The present invention solves the problem for the case of vocal cord generated (voiced) sounds. Because a part of the solution is a process for extracting f0 from noisy or obscured input waveforms in real time and also determining the integral of each cycle, it is expected to have broad application in many related fields.

BRIEF DESCRIPTION OF THE DRAWINGS

Other objects, features and advantages of the invention will be apparent from the following Description of the Preferred Embodiments of the Invention taken together with the accompanying drawings in which:

FIGS. 1 and 2 show the series of waveforms used above to describe the basic principle of the analyzer embodiment of the invention.

FIGS. 3 through 11 show the best mode of the invention currently known by the inventor for carrying out most of the functions of the analyzer/synthesizer.

DESCRIPTION OF THE PREFERRED EMBODIMENTS OF THE INVENTION

Figure 3:
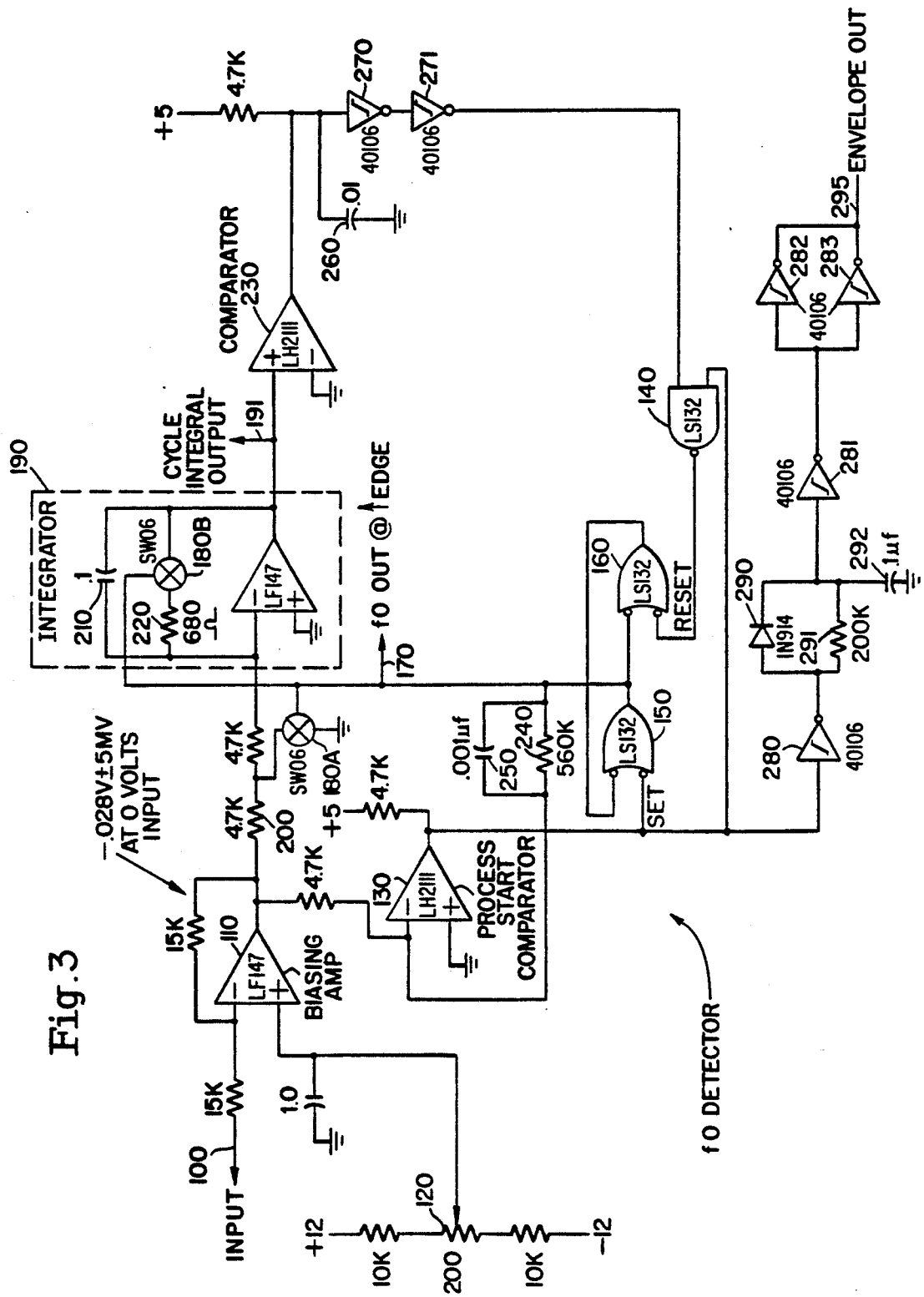
FIG. 3 is a schematic diagram of apparatus for detecting the fundamental frequency of an alternating current input wave in accordance with an embodiment of the invention which adds a bias voltage to the input wave before it is further processed.

For purpose of convenience in explanation, only the principal elements of the apparatus shown in the various Figures of the drawings will be described, it being understood that the interconnecting resistors and capacitors not specifically referenced are shown in the drawings and interconnect the principal elements of the apparatus.

Moreover, a detailed description of the principal elements and how they interconnect will be obvious from the Figures of the drawings and will not be preliminarily described in this specification. What is described in detail is how the various embodiments of the invention and their features operate.

Apparatus for Detecting f0 With Bias Voltage Addition (FIG. 3)

Referring to FIG. 3, shown is an illustration of how the fundamental frequency (f0) detector process in accordance with the invention can be implemented in hardware. This f0 detector apparatus uses a variant of the process which adds a bias voltage to the input wave before it is further processed. The bias voltage selected corresponds to the process starting threshold and also in effect offsets the integrator to integrate with respect to the starting threshold, which strategy is discussed above.

This biasing technique has the following benefits:

a. There is only one bias source required; in this example, a potentiometer.

b. All subsequent amplifier, comparator and integrator operations are referenced to zero volts.

The input 100 (FIG. 3, upper left) is the source of an alternating current (ac) input wave which is assumed to be passed through a capacitor to insure that the input is ac only, with an average direct current (dc) value of zero.

Alternatively, the input 100 is from a microphone or other source which is inherently ac only and referenced to zero.

For the circuit component values shown in FIG. 3, it is assumed that the smallest amplitude of interest is greater than about 200 millivolts.

Amplifier 110 is an inverting amplifier. In this example its gain is set at 1. The positive input of amplifier 110 is connected to potentiometer 120, which adds a dc offset to its output. For the values shown, an offset of −28 millivolts or more at the output of amplifier 110 has been found effective. For discussion purposes in what follows, assume a value of −28 mv.

This means that with no input (zero volts input) to the f0 detector, the output of amplifier 110 is negative by 28 millivolts. With the −28 mv output of amplifier 110, the quiescent condition of the circuit is as follows.

The output of comparator 130, with its comparison reference tied to zero, will be high, since the −28 mv is applied to its inverting input. This high level enables NAND 140, the source of the reset to the NAND 150/NAND 160 latch.

NAND 150 and NAND 160 comprise an RS latch. For the quiescent condition, the f0out output 170 of this latch will be low. This low output in turn causes analog switches 180A and 180B to be turned on. Switch 180A causes the input of integrator 190 to be at zero volts, while resistor 200 keeps amplifier 110's output from being shorted to ground by switch 180A. Switch 180B holds the integrator reset to zero by keeping integrating capacitor 210 discharged. Resistor 220 limits the discharge current when switch 180B is first turned on.

To see why the quiescent condition (φ volts at input 100, continuously) of the circuit is with f0out low, assume for a moment that it was high, enabling the integrator 190. In that case, the −28 mv into the integrator 190 would eventually cause the integrator 190 output to go positive, in turn causing the output of comparator 280 to go high. With two high inputs at NAND 140, the output of NAND 140 would go low, bringing the latch to the quiescent condition as described.

The final consideration is the effect that the offset will have when an input is applied. The average value of the input to input amplifier 110 will be zero. But at the output of amplifier 110 it will be −28 mV. In effect integrator 190 and starting threshold comparator 130, which are both referenced to zero, are referenced to a level 28 mv more positive than the input, as it will be applied to them by the output of amplifier 110.

Thus, comparator 130 meets the criteria for starting the f0 detection process and integrator 190 will integrate with respect to a level 28 mv higher than the true average value of the wave, which is sufficient to guarantee that the integral will return to its reset value before the end of cycle.

To see how the circuit works, assume an input wave applied to input 100 starts. As soon as it is more negative than 28 mv, (the given threshold in the given polarity) comparator 130 sets the RS latch. Note that the same level that activates the latch set also disables the latch reset line by providing a low input to NAND 140.

When the f0out 170 level of the latch goes high, it permits the integrator 190 to start integrating by opening reset switches 180A and 180B. It is also fed back through resistor 240 as dc hysteresis to comparator 130 and through capacitor 280 for further hysteresis. The feedback through capacitor 250 also has the effect, until capacitor 250 discharges, of holding the set input to the RS latch against input noise and holding the disabling level at NAND 140 until the integrator 190 output has gone sufficiently negative so that comparator 230's output is low. This provides the first period of time during which the value of the integral is ignored. Further extension of the first period is provided by the output of comparator 180 blocking NAND 140 from resetting the latch so long as the input wave at input 100 is negative with respect to the offset.

Integration then proceeds as required by the process.

The entire negative portion of the input (at 100) cycle is integrated. Because the input wave is biased so that the negative portion of the cycle applied to the integrator 190 by amp 110 has a larger area, shortly before the end of the cycle the output of the integrator 190 will go from negative to positive causing comparator 230's output to go high and reset the RS latch. Comparator 280's output is slightly filtered against noise by capacitor 260 and then shaped by two Schmitt trigger inverters 270 and 271. Thus, comparator 230 meets the process requirement of determining when the integral has returned to its starting value, whereupon the integrator 190 is reset.

F0 is measurable as the time between successive low to high transitions at f0out 170. Although the high to low transitions could also be used, there would be more variance in the detected output than with the transition based on the cycle process starting point.

The integral is available at 191. In this embodiment of the invention, because we have chosen to integrate the positive portion of the cycle out of amp 110 first and the integrator 190 is inverting, the integral will start from its reset value of zero, go negative during integration of the positive portions of the amp 110 output cycle and return to zero during the negative portion of the amp 110 output cycle. Because of the bias added to the negative portion, it returns to zero just prior to the end of cycle.

The circuit at the bottom of FIG. 3 comprised of Schmitt triggers 280-283, diode 290, resistor 291 and capacitor 292 perform the function of an envelop detector. The output of the envelope detector 295 goes high within a few microseconds of the leading edge of an input wave and goes low a few milliseconds after the trailing edge of the last input cycle.

The leading edge of the envelope detector has uses in electronic music, such as triggering an Attack, Decay, Sustain, Release (ADSR) envelope generator and also in other signal processing applications. The trailing edge tells us that a series of input cycles has ended.

The system of FIG. 3 has been built, tested and works well. To summarize, it has three outputs; F0out, the integral output and the envelope detector output.

Figure 4:
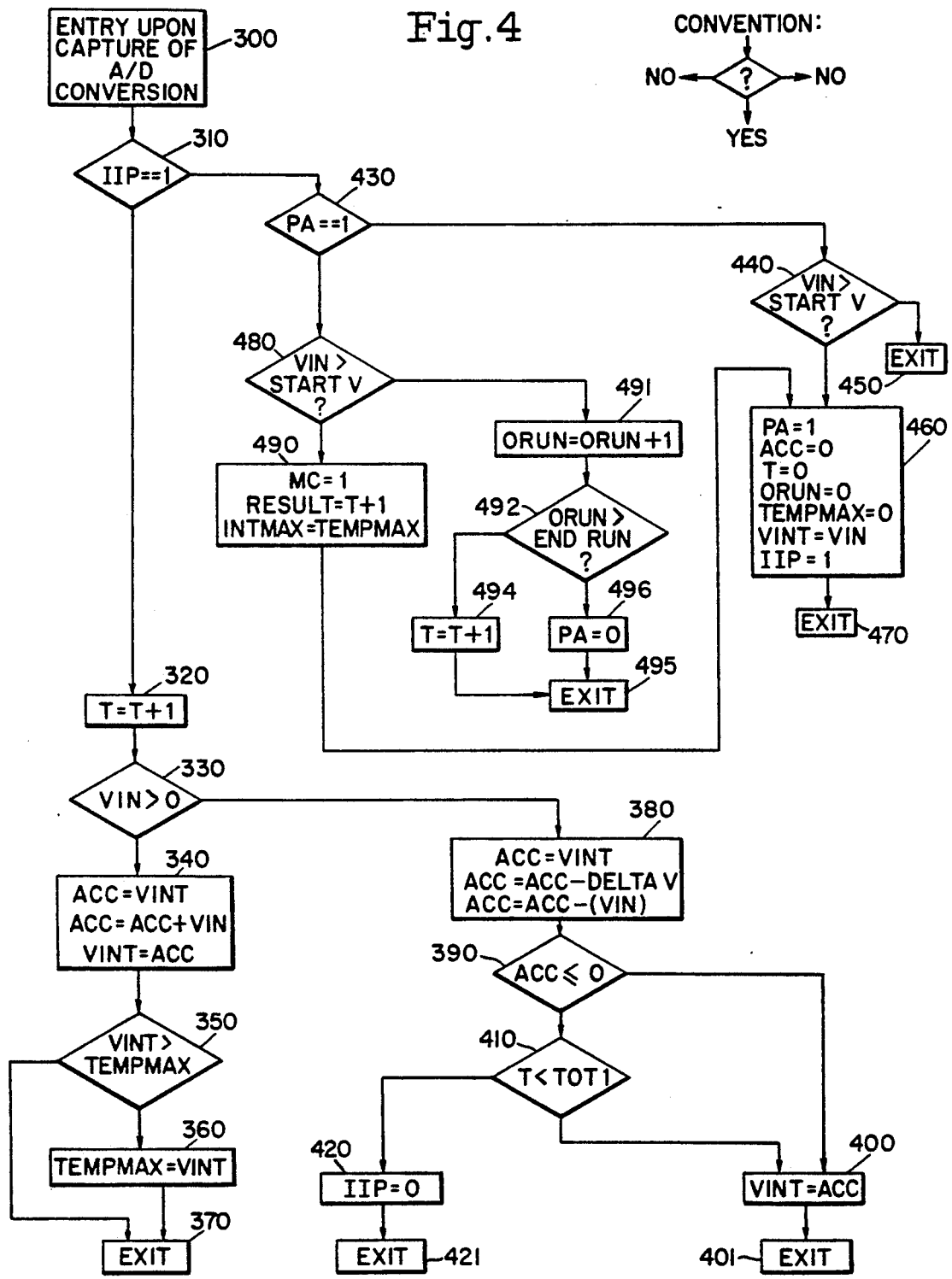
FIG. 4 is a flow chart which illustrates how the process can be implemented by a digital computer, with the input waveform sampled by an analog-to-digital converter.

Process for Detecting f0 With Digital Computer (FIG. 4)

FIG. 4 is a flow chart which illustrates how the process can be implemented with software by a digital computer processor, given that the input waveform is sampled by an analog-to-digital (A/D) converter.

Pursuant to the invention there are basically two types of techniques that are used. One technique, in which the conversion takes place at a regular rate and the digital processor is interrupted after each conversion. The other, in which an internal timer signals the processor (usually by an interrupt) to do a conversion and process the result.

The flow chart of FIG. 4 represents the processing that is done once per A/D conversion, which assumes only that associated software calls the FIG. 4 routine at some time between conversions, with enough time do the routine. The flow chart does not assume any particular processor, but uses features common to all processors, such as general purpose registers, accumulators, ability to service interrupts and ability to read/write a memory mapped or input/output (I/O) mapped latch or device.

In the flow chart, the convention is:
a=b means the value of b is assigned to a,
a==b means a is tested for equality to b.

Also in the flow chart, the "yes" branch of tests is down and the "no" branch is to the right or left.

The rate of conversion is chosen commensurate with the accuracy requirements for the highest frequency of interest and the various errors due to tolerances, etc., in accordance with the usual art in the digital signal processing field. The purpose of this flow chart is to illustrate that the process of extracting f0, in accordance with the invention, may be readily accomplished with a computer.

For a typical computer, certain registers, flags and constants are defined. For flags, 1 is true, 0 is false; that is, when the IIP (integration in process) flag is a 1, the integration portion of the f0 detection process is taking place.

Register and/or Location Definitions

ACC—Accumulator.

T—Register for accumulating number of A/D conversions/cycle. Note that for a fixed A/D conversion rate, the total number of conversion/cycle (T) multiplied by the amount of time between conversions equals the period of f0. Thus, it is sufficient to find a value of T to know f0.

ORUN—Over run counter. Used to detect last cycle.
VIN—Location for input of conversion value.
VINT—Storage location for integral in process.
RESULT—Storage location for T at end of cycle.
INTMAX—Storage location for maximum value of the integral. A result used by other software. Loaded at end of cycle from TEMPMAX.
TEMPMAX—Location used during process to obtain maximum value of the integral obtained during the cycle.

Flag Definitions

MC—Measurement complete flag. Lets other software know that a new measurement is available at RESULT and INTMAX. Set to zero by software that uses RESULT and INTMAX. For some processors MC might represent a software interrupt.

IIP—Integration in process.

PA—Process Active. The value of this flag is the functional equivalent to the envelope detector output in the FIG. 3 apparatus and may be used as such if wanted.

Constants t0t1: The number of A/D samples between t0, the process starting time, and t1, the end of the "first period of time during which the value of the integral is ignored". t1 is also the start of the "second period of time" which lasts "until the value of the integral is insubstantially different from its value when the integration started".

deltav: The amount to use so that the integral of the negative areas will always outweigh the integral of the positive areas.

startv: Voltage at which the process starts (20 of FIG. 2). In this example, startv is a positive value. Startv must be set at least slightly above the peak random noise voltage measured by the A/D converter with no input signal present.

endrun: Over run counter count at which the MIP flag is reset, to indicate no input for some period of time.

Certain features of the process as implemented in flow chart form illustrate the sort of design options which are available, without changing the basic process.

Specifically:

The positive portions of the cycle are integrated with respect to zero. So are the negative portions. However, whenever a negative input is detected, an additional negative quantity, deltav, is included to make the integral sum to zero before the end of cycle.

The "first period of time" as set by the t0t1, during which the process "ignores the value of the integral" provides the function of forcing the integration to proceed for a fixed number of samples. If, during those samples, the integral should go briefly negative as the result of noise, or waveshape, it will not allow an early improper end to the cycle measurement process.

Unlike the FIG. 3 apparatus embodiment, the value of the integral will be positive.

The maximum value of the integral each cycle is made available as an output for use as needed by other software functions.

Note that in both the FIG. 3 apparatus and FIG. 4 software embodiments the peak values of the input wave each cycle could be captured if desired for a particular use.

In the flow chart description which follows, reference will be made to events depicted on FIG. 2 to relate the process in the computer to the graphical depiction of the process in FIG. 2, the purpose being to increase comprehension of the flow.

The flow chart on FIG. 4 is entered by the computer subsequent to capture of an A/D conversion, at 300. At this point the IIP flag is tested to see if an integration is in process, at 310.

If the integration is in process, then the process is in the time period of FIG. 2 between events 20 and 40. The T count is incremented at 320 and then a test is made to see if the converted input is greater than zero, at 330.

If the input is greater than zero, this means that the integral will be increased, is moving away from its reset value and therefore this conversion is not going to move us towards the process end criterion. The input is added to the integral accumulated in prior passes through the flow chart (340) and then tested to see if it is the peak thus far, (350) and if so, the sum is stored as the new peak (360), prior to exiting the flow chart at 370.

Returning to the test at 330, now suppose the A/D input was 0 or less in that case, at 380 we subtract from the integral the absolute value of the input and also subtract the bias, deltav, which will cause the integral to return to its reset value before the end of the cycle.

Perhaps this last subtraction is the one which in fact does take the integral to (or even past) its reset value of 0; that is FIG. 2 event 40. This is tested at 390. However, even if the integral is 0 or less, it is possible also that we are in the t0t1 time; that "first given period of time" where we "ignore the value of the integral and continue the process. This possibility is tested at 410 and if it is the case, the integral is stored (400) and the routine exited until next called.

Of course, if the integral at 390 is not less than or equal to 0, the process will continue with the next A/D event. For now, the integral is stored and the routine is exited.

If the test at 410 indicates that the process is past the t0t1 period, then this indicates that the end of integration criteria has been met, the IIP flag is reset at 420 and the routine is exited.

The above takes care of all the cases where integration is in process.

Returning to 310, consider the case of an integration not being in process. If this is the case, there are three possibilities:

(a) The process could be in the time interval corresponding to FIG. 2 events 40 and the following 20.

(b) The process could be in a no input condition immediately after the last cycle of a series.

(c) The process could be in a no input condition which has already lasted longer than the overrun time set by the endrun constant defined above.

To determine which of the above applies, the Process Active flag is tested at 430. Assume the case where it is zero. Then we are in condition (c) above. Perhaps, however, this input is above the given amplitude in a given polarity defined by startv, to start the f0 detection process. This is tested at 440. If not the case, then the routine exits at 450.

Alternatively, this could be the input corresponding to event 20 of FIG. 2. In that case the result of the test at 440 would be the process initializations at 460, after which the routine exits at 470.

Returning once again to 430, now assume that the Process Active flag equals 1. This corresponds to (a) or (b) conditions described above. In terms of FIG. 2, we are either between events 40 and 20 the following, or between event 40 and the overrun counter exceeding the endrun constant.

The test at 480 is looking for the condition at FIG. 2 second occurance of 20. If found, this signals the end of the detection process and at 490 the Measurement Complete flag is set, the number of A/D samples (samples multiplied by the time between samples will give the detected period of f0) is placed in the RESULT output location and the peak of the integral is placed in the OUTMAX location. Since this is also the start of a new cycle as well as the end of the old one, the next step is to 460, where all the process variables are initialized for the new cycle and the routine exits at 470.

Consider now the case where the result of test 480 is that event FIG. 2 second occurance of 20 has not happened yet—or may never happen. To deal with these cases the overrun counter is incremented at 491 and then tested at 492. If in excess of the endrun constant, then there is no input; the Process Active flag is set to 0 at 496 and the routine exits at 495.

Alternatively, if the test at 492 does not show the overrun counter in excess of the endrun constant, then the process may well be in the time frame between FIG. 2 40 and the following FIG. 2 20. In this case the samples counter is incremented at 494 and the routine exits at 495.

Those skilled in the art of computer programming will recognize that the above is but one particular software embodiment of the f0 detection process in accordance with the invention. However, that is sufficient to demonstrate that the process is implementable with generally available computer methods.

Use of the f0 Detection Invention With a Human Voice Input

The f0 detection invention can cope with a variety of distorted, noisy and high harmonic content waveforms. However, in order to measure f0 for the human voice, an additional procedure is employed. That is, to use the circuit with an ordinary microphone placed in contact with the user. If an ordinary microphone is placed against the lips it interferes with singing or talking. But a person may hum into it and get excellent results.

If the pickup end of the same microphone is placed against the throat so as to pick up vocal cord vibrations through the throat, it is necessary to have a different gain setting to get equivalent results, but excellent results are obtained. That is, the user may freely sing or speak and f0 is quite well detected for virtually all voiced voice output.

The use of a microphone in contact with the user accomplishes two functions. The first has to do with amplitude control and the second with filtering.

If one attempts to use a microphone to detect speech or singing, the microphone output amplitude varies with distance to the sound source. It may, in fact, vary several orders of magnitude, depending both on voice loudness and how far away it is held from the mouth, from very close to perhaps as far as 10 or more inches. Also, in the presence of ambient noise, the signal to noise ratio will vary, with noise sometimes exceeding signal.

A microphone in contact with the user eliminates these problems. Input amplitude will vary over a much more restricted range. It will also be typically much greater than ambient noise pickup. In particular, it is possible to set the gain stage following the microphone so that minimum to maximum voice loudness is within the effective dynamic range of the f0 detector, from the softest voiced sound to the loudest.

The use of a microphone in the above manner is important. Prior art has attempted to solve the varying amplitude input problem using approaches based on AGC (Automatic Gain Control) circuits. The problem with these is that they all work by averaging input over some period. By the time they have taken effect, it is too late for cycle-by-cycle analysis. Some low amplitude cycles may be lost. The contact method provides a physical means for "normalizing" input amplitude without "losing" cycles. That is a critical requirement for real time f0 measurement and real time cycle integral measurement.

Furthermore direct contact pickup increases the measured amplitude of the vocal cord vibration. The source of voice energy is very strong when sensed with direct contact, relative to the voice formants which are derived via head cavity resonances. This relative strength makes it all the easier to detect f0. The f0 detector described herein works excellently with these "filtered" waveforms and less so with airborne waves.

It should be added that the mass of the microphone holder and the applied pressure to the microphone are of noticeable importance in use of the microphone for picking up waves by contact.

Although it may be possible to apply electronic filtering and/or some kind of delay line based AGC (detect the AGC required, and apply it to a delayed version of the input) for signal pick up by microphone through the air, it seems pointless for many applications. A contact pickup approach beneficially eliminates the need for these extra circuits, and any AGC scheme introduces delays.

It should be pointed out that the waveform picked up by contact has a strong peak of one polarity each cycle. This is due to the "relaxation oscillator" type sound production of the vocal cords. This may be beneficially taken advantage of. If the detection system is arranged so that this peak is of the same polarity as the starting threshold of the f0 detector, there appears to be some further advantages in noise and/or distortion rejection.

Figure 5:
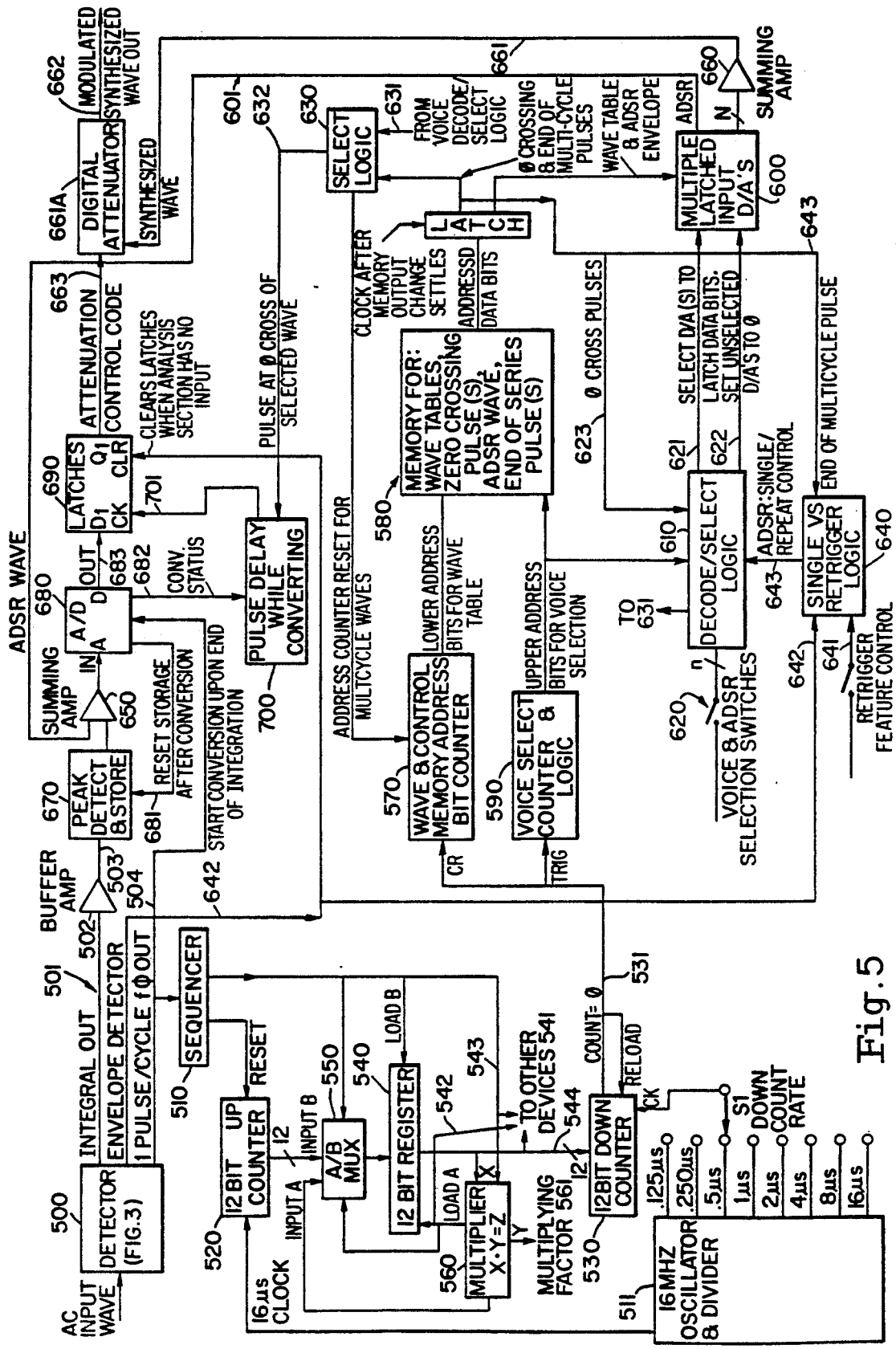
FIG. 5 is a block diagram showing how the fundamental frequency detector is used in an analyzer/synthesizer.

Analyzer/Synthesizer Using FIG. 3 f0 Detector (FIG. 5)

Referring to FIG. 5, the block diagram shows how the f0 detector apparatus of FIG. 3 can be used in an analyzer/synthesizer in accordance with another embodiment of the invention.

The f0 detector 500 is at the upper left. Its outputs include from FIG. 3: the integralout, the envelope detector and the one pulse per cycle f0 out.

The f0out output of the f0 detector 500 is used to trigger a sequencer 510. The sequencer 510 puts out two pulses which are timed not to overlap the clock pulses from the 16 MHz oscillator and divider 511 to either the 12 bit up counter 520 or the 12 bit down counter 530. These two pulses:

(a) First load the 12 bit register 540 through A/B MUX 550 with a copy of the contents of the 12 bit up counter 520 and then (b) Reset the 12 bit up counter 520.

The function of the 12 bit up counter is to measure, with 16 microsecond resolution, the period of f0. At the end of each cycle the measurement is transferred to the 12 bit register and held there until the end of the next cycle, at which time the 12 bit register is updated.

The same LOADB pulse that loads the 12 bit register 540 also triggers a multiplier 560. When triggered by the LOADB pulse, the multiplier 560 multiplies the contents of register 540 by a multiplying factor 561 and places the result back into register 540. The multiplier speed must be such that it is less than a 64th of the period of f0. For audio applications, this requirement is readily met. The function of the multiplier is to cause the waves to be synthesized to be at another key than the key of the f0 input. To accomplish this, the multiplying factor 561 need only be in the range between 1 and 2.

The contents of the 12 bit register 540 is fed to the 12 bit down counter 530 as a number to reload every time it down counts to zero. Appropriate timing means may be employed to ensure that the counter is not reloaded while the register value is changing.

The down counter 530 continuously counts down at a selectable rate. As it does so, its COUNT=0 pulse acts as the clock of an address counter 570 whose count addresses the lower order address bits of a memory 580. The data in memory 580 may be structured so that the lowest order bits address all the points that define one cycle of a wave table; for example, the lowest 6 bits might define a cycle of a wave with 64 addressed digital values. The next bits would define which cycle of a multicycle wave is being accessed. For example, using the next three bits would allow accessing of an 8 cycle wave. Finally, the next address bits up could be used to address a particular multicycle wave table. This last set of bits could be either generated from a fixed source such as a register or switch, or alternatively, from a counter and associated logic 590.

An advantage to using a counter and logic 590 is that it permits effectively simultaneous access of more than one wave table. The technique for achieving this is as follows: The underflow of the downcounter 530 generates a pulse 531. Pulse 531 increments the lower order address bit counter 570. It also triggers the voice select counter and logic 590. When voice select counter and logic 590 is triggered, it counts a full count and stops, counting at a high enough frequency that it will count a full count before another pulse 531. For example, if the counter in 590 is a 3 bit counter, then it will address 8 different wave tables, each of which may then with appropriate timing be directed to a different digital to analog converter (DAC) 600, where that means has input storage, to hold the addressed wave table value until the next time that particular table is addressed.

It may be the case that a user does not want to generate and convert all the possible wave tables simultaneously. Voice and ADSR selection switches 620 permit selection of one or more wave tables as desired. Decode/select logic 610 decodes the addresses from counter and logic 590 and where the code corresponds to a selected switch 620, a latch pulse 621 is generated to latch the wave table value into the input latch of DAC 600.

Likewise, if a wave table has not been selected by ADSR and voice selection switches 620, then the logic 610 outputs a pulse 622 to reset the DAC 600 input latch. There are two ways this reset may be accomplished. One is simply as a direct reset from pulse 622 if the latchs of DAC 600 permits it. The other is to use a synchronizing pulse 623 from one of the bits of the memory 580 dedicated to this purpose. This pulse is generated when the associated wave table(s) have a zero crossing. At that time the logic 610 puts out a select pulse 621 to the DAC 600 which latches in the wave table zero value.

As seen above, the memory 580 has more stored in it than just multiple wave tables.

The outputs of the memory 580 fall into the following categories:

a. digital representations of the amplitude sequences of a waveform as represented by some of the bits of the memory.

b. A bit associated with the zero crossing of the wave in the wave table. There may be one such bit for every wave table, or, where tables have a common zero crossing point, one such bit may be common to several of them, reducing the required memory bit width.

c. A bit associated with the last cycle of a multi-cycle wave. As described above, the upper bits of counter 570 may be used as cycle select for a multi-cycle table. However, this permits only binary numbers of cycles, assuming the addresses to be generated by a binary counter. By programming a bit in the memory to change state when its associated wave table is at the end of any arbitrary series of cycles, this restriction can be overcome.

The zero crossing and last cycle bits described above can be passed through select logic 630, which receives its control from the decode/select logic 610 via terminal 631. Thus, these features are selected along with their associated wave tables.

d. A feature associated with multicycle waves is the ADSR envelope generator. An ADSR envelope can be programmed into the memory 580 and generated along with any other wave table under control of the decode select logic 610. The ADSR envelope 601 output from DAC 600 can be summed for amplitude control purposes, as described below.

The ADSR wave 601 is applied as one input to summing amplifier 650, whose function is described more fully below. Selection of an ADSR wave to be D/A converted is jointly under control of the selection logic 610 and single vs retrigger logic 640. The logic 640 is under control of a re-trigger feature control input 641. It functions as follows: The D/A enable for the ADSR wave coming from 610 is under the further control of logic 640. If non-retrigger is selected, then the leading edge of the envelope detector, 642, conditions logic 640 to enable the ADSR D/A. At the end of the ADSR envelope, an end of multicycle pulse 643 in conjunction with the non-retrigger selection from input 641, cuts off further enabling of the ADSR until the next leading edge of envelope detector 642. If the retrigger feature is selected, then the ADSR wave is repetitively generated as long as the envelope detector 642 shows an input is present to f0 detector 500.

The non-ADSR waves from the D/A's 600 are shown summed by summing amp 660, although they could be treated separately as to ADSR or other modulation with additional hardware (not shown) similar to that described below:

The summed synthesized wave 661 is applied to a digital attenuator 661A, which controls its output amplitude 662 by attenuating from 0 to 100% under control of a digital code 663.

This code 663 only changes value at a time when the wave 661 is at a zero crossover, thus keeping modulation products out of the output wave.

The modulation code 663 is based on the peak value of the integral and also optionally the ADSR wave if selected. The integral output 501 of the f0 detector 500 is buffered by buffer amplifier 502 and applied via line 503 to a peak detect and store circuit 670. The output of circuit 670 is passed through summing amplifier 650 to A/D 680. At the end of each conversion by A/D 680, it causes the storage means in 670 to be essentially instantly reset to zero via reset line 681 in anticipation of storing a new peak input.

Converter A/D 680 performs its A/D conversion in response to the end of integration signal 504. Thus, there is one conversion of the stored peak of the integral of the input wave for each cycle of the input wave.

The A/D 680 output 688 is applied to latches 690, which are updated at every zero crossing of the synthesized wave. The latch update pulse originates at memory 580 and is applied through select logic 630 under control of signals 631 from the decode/select logic 610. Selected zero crossing pulses 632 are applied to delay circuit 700. This circuit delays the latch update pulse 701 in the event that a zero crossing pulse 682 arrives during the time the A/D converter 680 output is changing, as per status signal 682.

The result of all the above is that the attenuation control code 663 is the result of the converted integral output 501 optionally summed with an ADSR wave 601 and the code only changed at synthesized waveform 661 zero crossings so as to avoid generation of modulation products.

Note that the control code latches 690 are cleared by the envelope detector output 642. This has the effect of entering a code for 100% attenuation, which is appropriate to a no input condition at the f0 detector 500.

At the left of FIG. 5, the load A pulse 542, the load B pulse 543 and the output of the 12 bit register are shown going to a destination called "TO OTHER DEVICES" 541. These are any other devices which could make use of either the detected f0 period, or the multiplied period. Such devices could include a MIDI interface, a frequency indicator, an entire additional synthesizer section, or a digital recorder, recording frequency on a cycle by cycle basis. Furthermore, between the f0 input and this point, there is a complete frequency detection and measurement subsystem.

Figure 6:
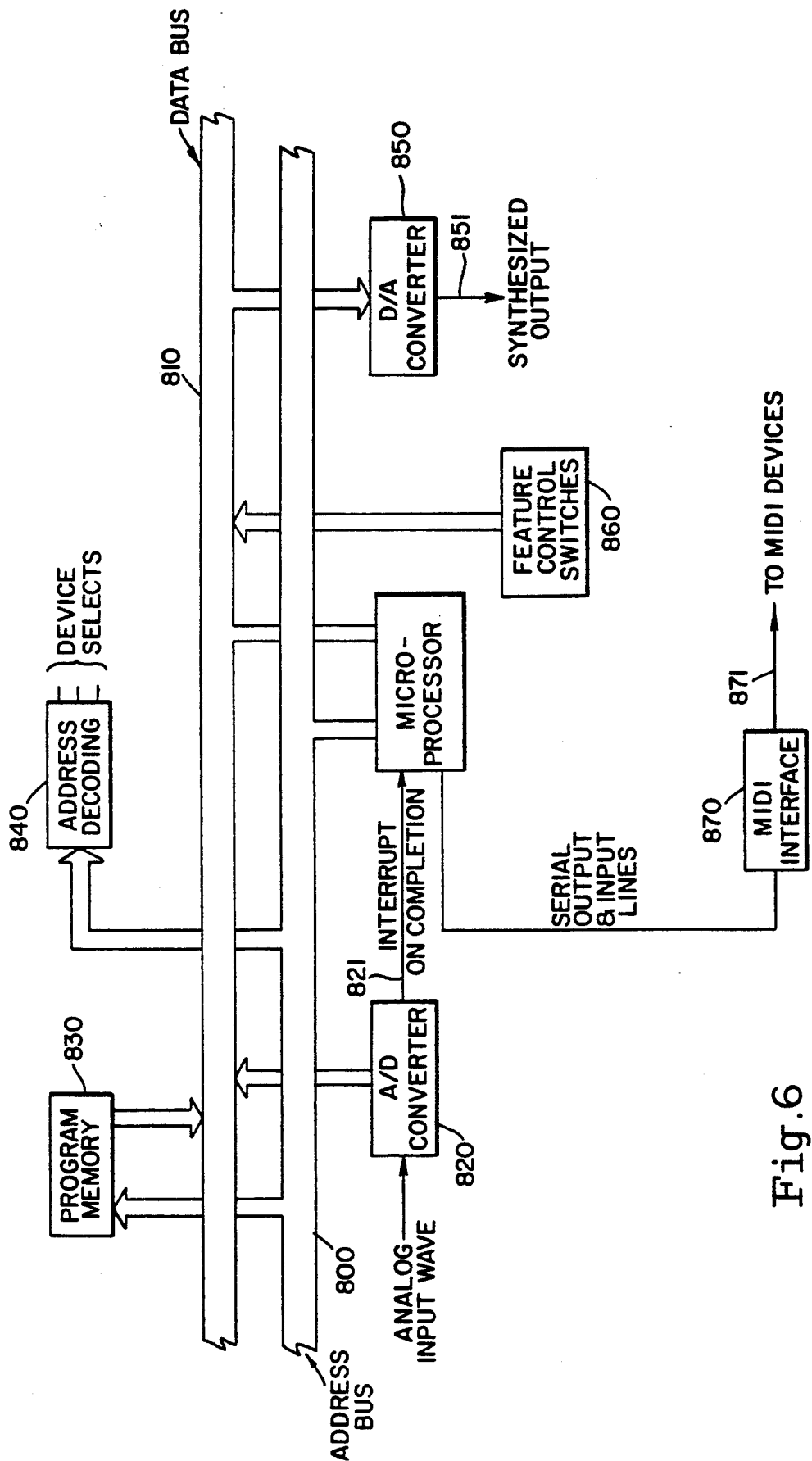
FIG. 6 is a block diagram showing an analyzer/synthesizer using a commercial processor based fundamental frequency detector.

Analyzer/Synthesizer Using Processor Based f0 Detector (FIG. 6)

Referring to FIG. 6, an analyzer/synthesizer is shown using a processor based f0 detector, such as the Texas Instruments microprocessor 320C25.

FIG. 6 shows the peripheral devices sharing the address 800 and data 810 busses. The read/write line, decode strobes and other details of control lines are not shown, as they are used in accordance with standard practice for such devices. The 320C25 microprocessor contains enough on-chip RAM memory for the application, which is why no RAM is shown. Other microprocessors might require external RAM.

The input device is the A/D converter 820. It is set up for conversion at a fixed rate and interrupts the processor after every conversion 821, at which time the interrupt handler reads its output and could handle it per a flow chart program such as that of FIG. 4.

The other important blocks on the diagram are:

a) Program memory 830, which contains the application program.

b) Address decoders 840, which select the various I/O devices.

c) A D/A converter 850 to provide an analog output.

d) Feature control switches 860, which allow a user to control such features as ADSR characteristics, octave shift, selected waveform table, etc.

e) A MIDI interface 870. This processor, in common with many others presently available, has separate serial input and output ports, providing the basic I/O data stream required for MIDI devices.

Another feature of the 320C25 processor is an internal programmable timer. This timer is an auto reloading down counter which generates an interrupt on each downcount to zero and reloads from a memory mapped internal register. Although it down counts at a fixed frequency (100 ns/count for the processors maximum clock rate), unlike the hardware counter implementation of FIG. 5, it can achieve the same function as follows:

When the A/D interrupt handler produces a new value of T, the processor calculates a value to place in the timer reload register in accordance with the downcount rate and the setting of the octave shift switches so that the countdown/interrupt rate will be appropriate to the desired octave output and the number of points per output waveform.

That is, if a 32 point waveform table is being used and no octave shift is selected, then a value is calculated so there will be 32 programmable timer interrupts in the measured f0 cycle.

At each timer interrupt, the appropriate amplitude value, modified by ADSR factor table, time from start of input wavetrain and input amplitude are used to calculate a value to send to the D/A 850 for analog output.

If a MIDI output function has been selected by the feature switches, the serial function complete interrupts will also have to be handled, to output the latest frequency and amplitude values, as well as other MIDI function selections. Note that the processor will also have to calculate the note to send by picking the note closest to the measured f0. Note that "closest" may have a non-linear definition.

As can be seen from the above, a processor embodiment of the f0 detection process in conjunction with a synthesizer system is readily implemented. Although other approaches are possible, it can be seen that an interrupt driven design readily lends itself to the functions desired and common processor architecture.

Other features, such as calculated interpolated values for the D/A output, may also be implemented to provide a more precisely shaped output waveform.

Detailed Circuitry of FIG. 5 Analyzer/Synthesizer (FIGS. 7-11)

FIGS. 7 through 11 show the detailed circuitry for carrying out most of the functions of the analyzer/synthesizer of FIG. 5.

FIGS. 7 through 11 show the present embodiment of the f0 detector as part of an analyzer/synthesizer, illustrating some of the new and novel synthesizer features obtained as a result of real time frequency and amplitude control. This is an entirely hardware based implementation, although the entire process could be achieved by a software based implementation as described above.

Figure 7:
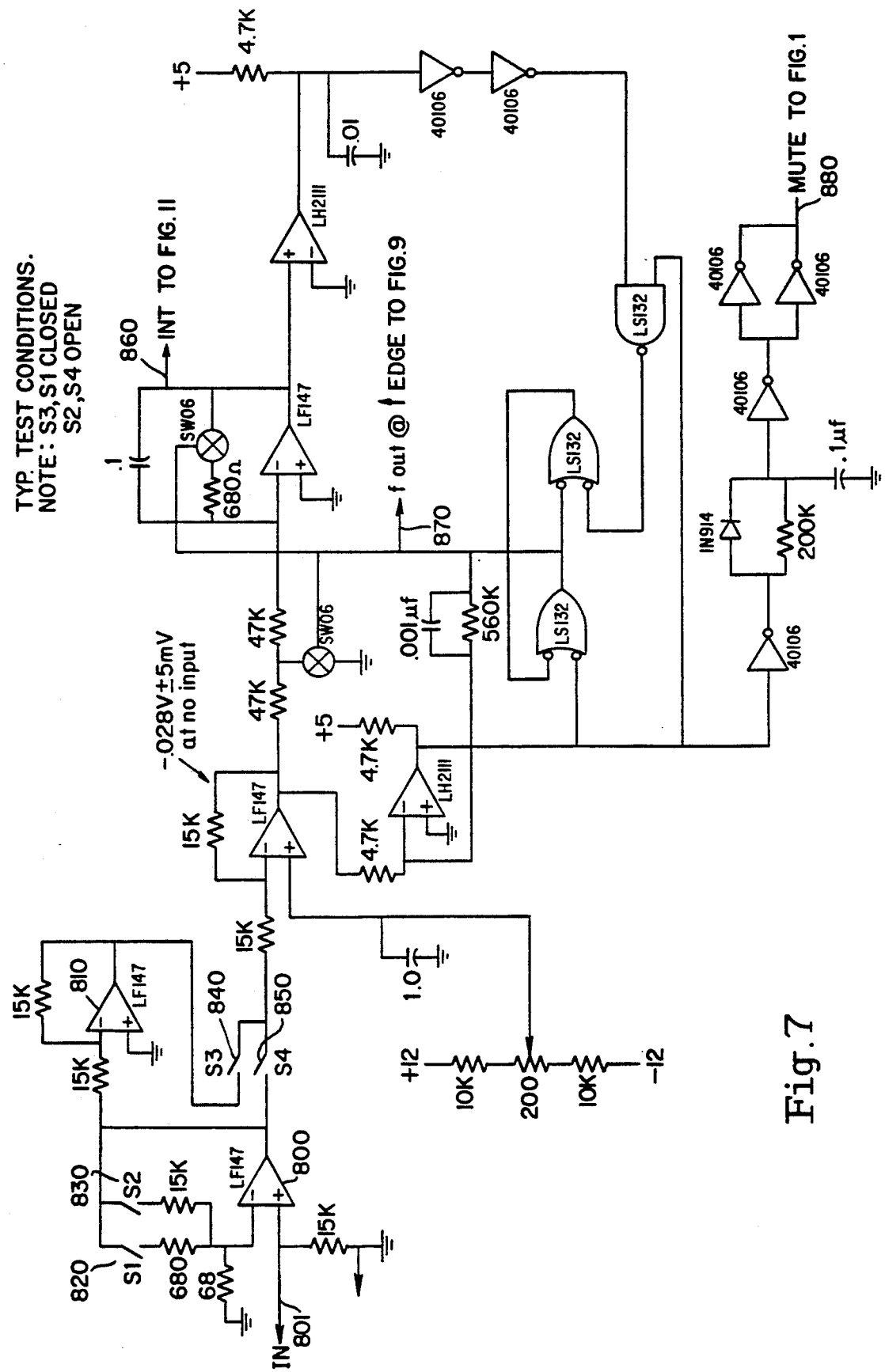
FIGS. 7 through 11 are detailed schematic diagrams of a working embodiment of the analyzer/synthesizer in accordance with the invention.

The input to the circuit is through the f0 analyzer of FIG. 7, which is identical to the circuit of FIG. 3 except for the following: Input 801 is applied to an amplifier 800 whose gain may be adjusted by switches 820 and 830 and the output of 800 can either be inverted or not under control of switches 840 and 850. This switchable input gain stage adapted the prototype to the microphone sources used and allowed experimentation with polarity reversal.

The f0 detectors three outputs are the integral 860, the f0out 870 and the envelope detector output 880.

Figure 8:
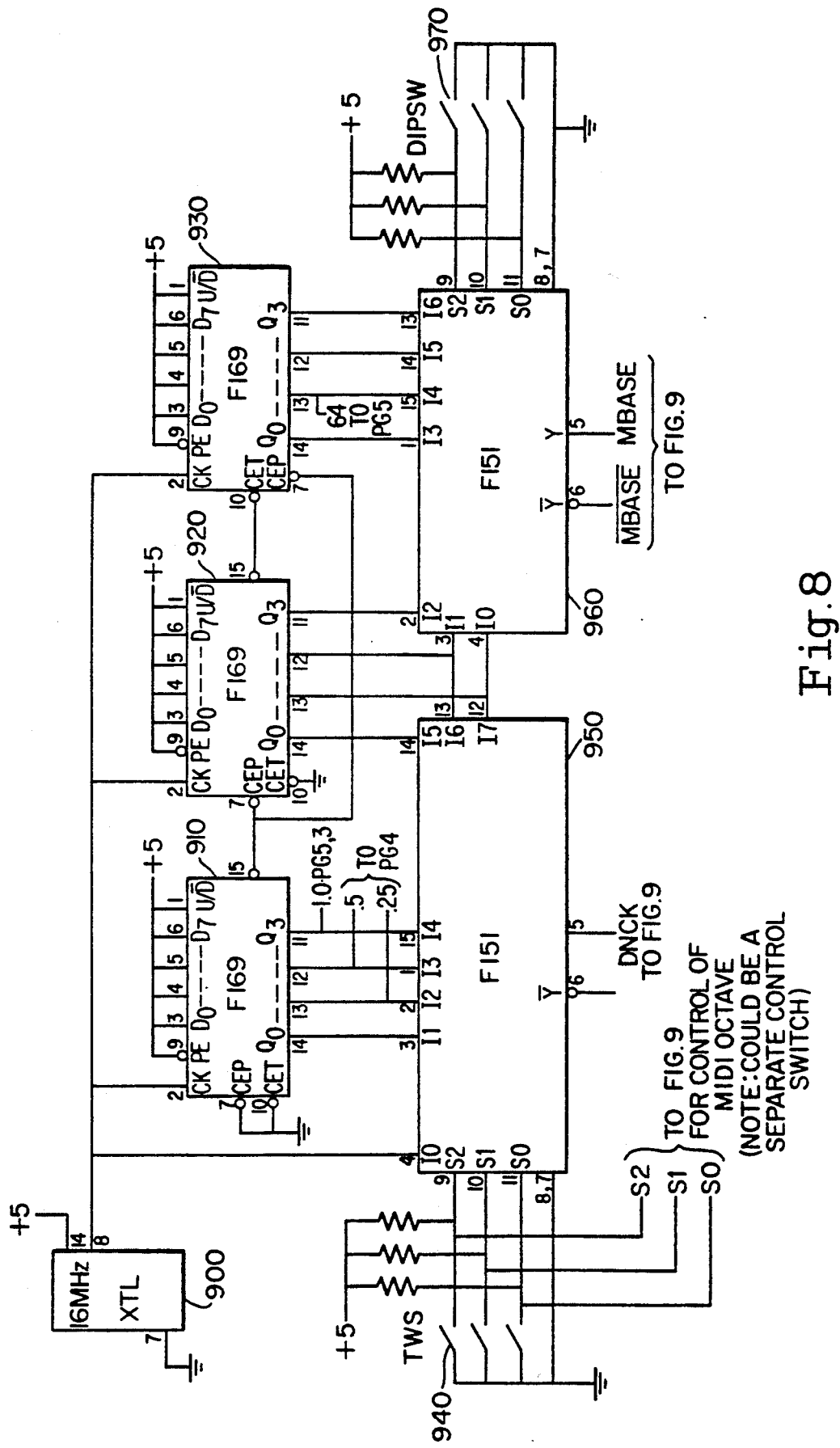

FIG. 8 shows the time base generation section of the device corresponding to 16 MHz oscillator and divider 511 on FIG. 5. A 16 MHz crystal oscillator 900 at the upper left provides a stable time base. However, since the system is ratiometric, any fairly stable oscillator of appropriate frequency would do. Note further that the higher the frequency that can be used the greater the accuracy that can be obtained and the more points that can be addressed by the synthesizer.

The oscillator 900 output is divided by three cascaded 74F169 binary counters 910, 920, 930. The counters' outputs are labeled by their period in microseconds, i.e. 0.25, 0.5, 1, 2, 4, etc. and their destinations on other Figures.

Two switch controlled 74F151 selectors 950 and 960 are also shown. Selector 960 receives its input from the last 5 stages of the frequency divider. One of those inputs is selected under control of the switches 970 and forms the MBASE and MBASE* (the * indicates a term with a bar above it). The measurement base (MBASE) will be used to drive an upcounter whose function is the same as the upcounter 520 in FIG. 5. In a commercial product, MBASE would not normally be switch selectable. In this embodiment, it was done to evaluate the effects on performance of changing the measurement resolution.

Selector 950 receives its inputs from the first 5 stages of the frequency divider as well as the oscillator 900. Its output is controlled by a thumbwheel type switch 940 (a slide switch or computer controlled register would also be appropriate) to select the frequency of the DNCK (downclock) signal. This down clock signal is used to clock a downcounter whose function is the same as the down counter 530 in FIG. 5.

Figure 9:
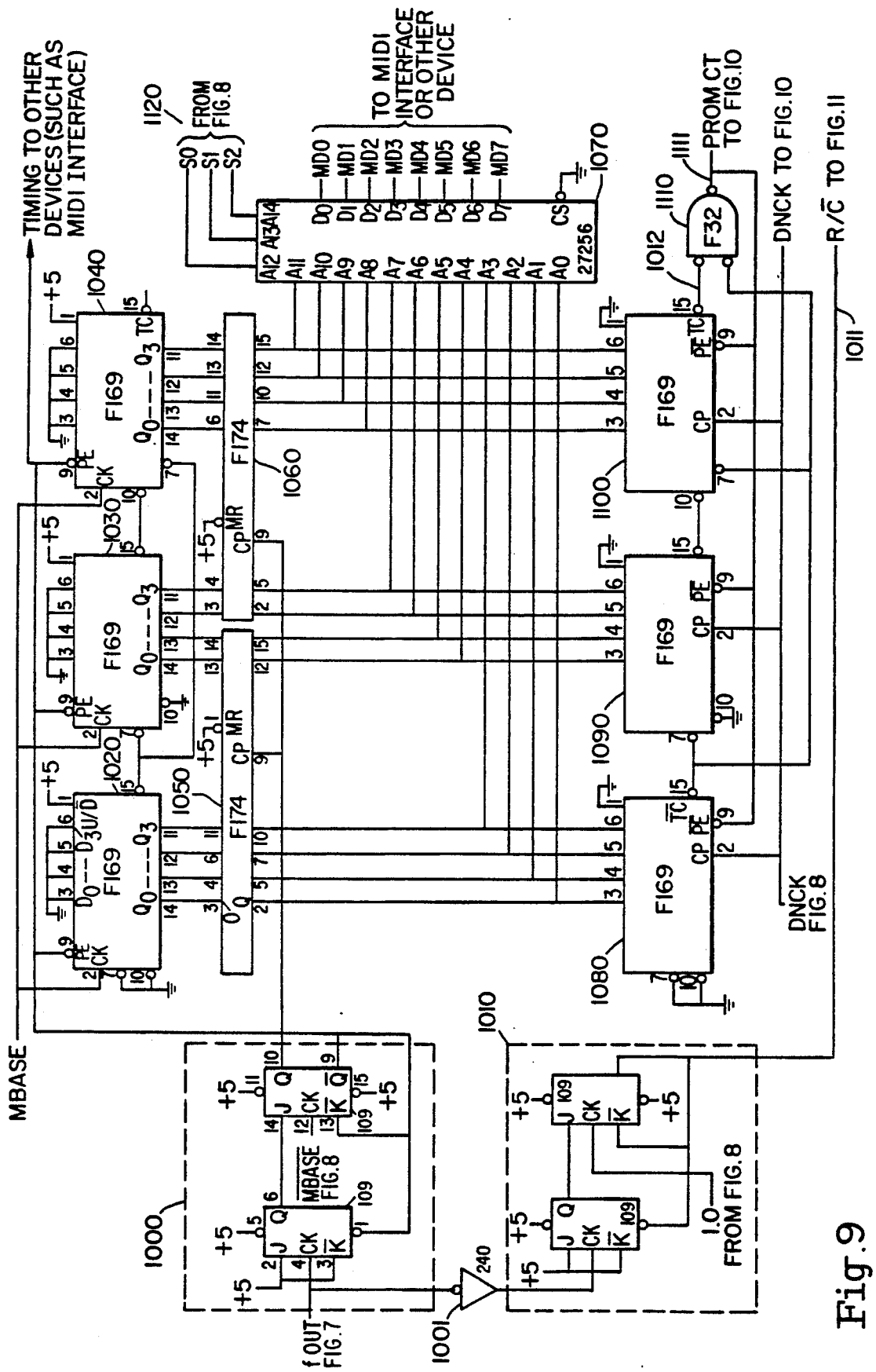

FIG. 9 shows the up and down counters 520 and 530 and the 12 bit register 540 whose functions were explained re FIG. 5. The up counter 520 comprises counters 1020, 1030, 1040 and the down counter 530 comprises counters 1080, 1090, 1100. They are implemented with 74F169's. The 12 bit register 540 of FIG. 5 is implemented with 74F174 hex registers 1050, 1060. The upcounter 1020-1040 is clocked by MBASE while the downcounter 1080-1100 is clocked by DNCK.

The upcounter 1020-1040 will accumulate a count which is a measure of f0. This count will be transferred to the 12 bit register 1050, 1060 at the start of each new f0 cycle to be measured. It will be held in the register as the value to reload into the downcounter 1080-1100 every time the downcounter reaches zero. TC (toggle carry) output 1012, which is active at down count equals zero, is fed back through a gate 1110 to the reload (PE*) of all the downcounter stages, to achieve an automatic reload at downcount equal to zero.

A technique is also disclosed for translating the measured f0 value into a code representing a particular musical note. (Frequency input or range of frequencies input.) A PROM 1070 (FIG. 7, right) is addressed by the 12 bit register 1050, 1060 representation of f0. PROM 1070 is programmed so that for a given range of f0 measurement, it outputs the MIDI code for a related note. PROM 1070 inputs A12-A14 (1120) can be used to octave shift the output note by selecting areas which are programmed accordingly.

The function of the sequencer 510 of FIG. 5 is performed by the dual 74F109 sequencer 1000 (FIG. 9, upper left). Sequencer 1000, upon detection of the rising edge of f0out from the f0 detector, will synchronize that event with MBASE* to produce a pulse whose leading edge clocks the upcounter 1020-1040 contents into the 12 bit register 1050, 1060 and whose width is one MBASE period. This pulse is applied to the PE inputs of the upcounter 1020-1040 so that, on the next MBASE rising edge, the upcounter 1020-1040 is loaded from its D inputs. As these are all at zero volts, the count goes to zero and thereafter counts up again.

f0out (FIG. 9, left) is applied to an inverter 1001, whose output is applied to a sequencer 1010 functionally identical to sequencer 1000. However, in this case the second stage of sequencer 1010 is clocked by the 1 MHz clock and the result is a one microsecond pulse on the R/C* line 1011. This pulse is coincident with the end of the integration process of the f0 detector. Its use as an amplitude A/D conversion trigger will be described later.

Figure 10:
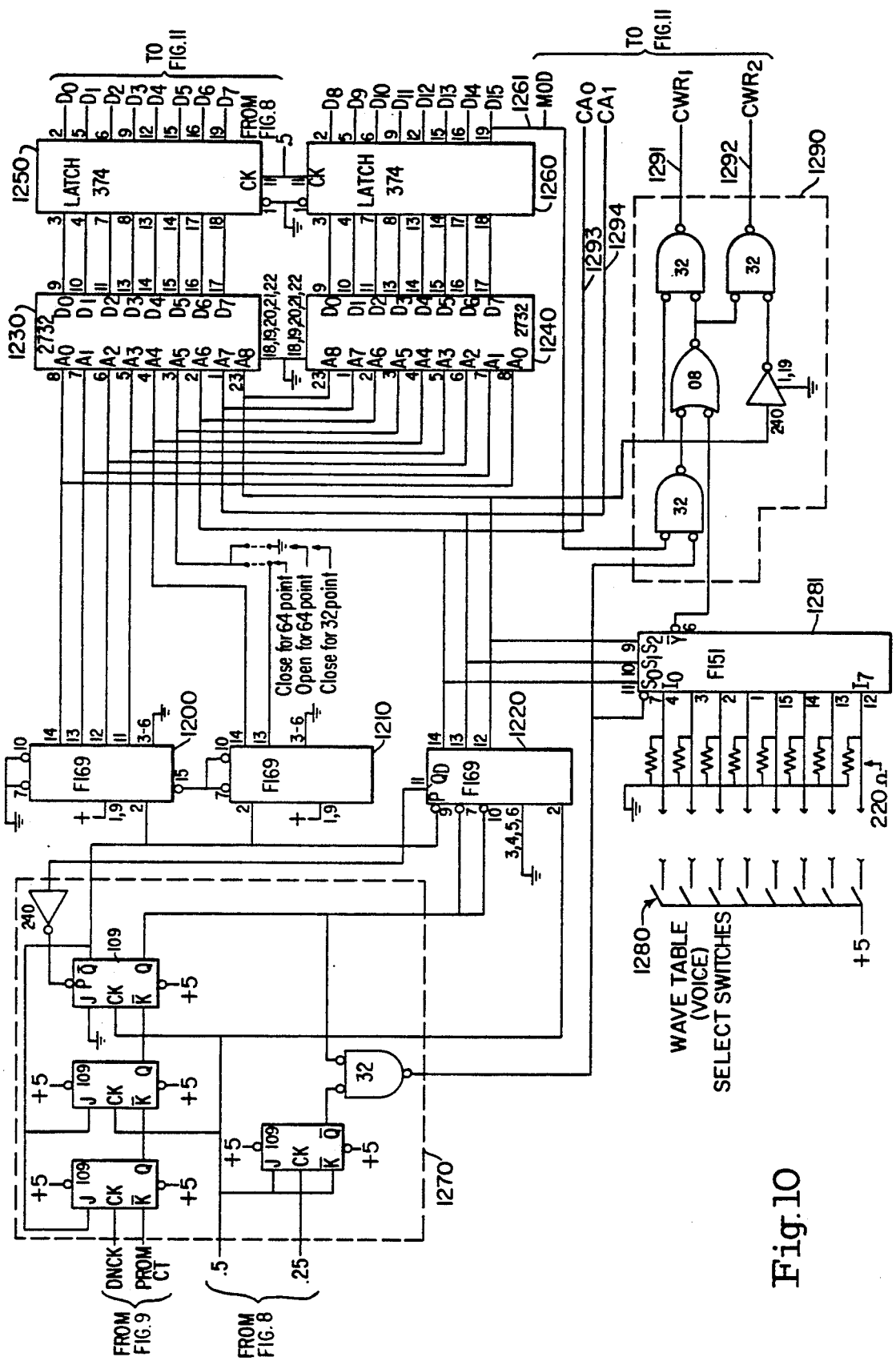

FIG. 10 shows the address counters 1200, 1210 and PROMS 1230 1240 which create the digital representation of the synthesized waveform. These correspond functionally to the address counters 570 and and memory 580 shown on FIG. 5.

The circuit of FIG. 10 has the ability to utilize PROMS which are programmed for 32 point representations of the stored waveform, or PROMS which are programmed for 64 point representation of the stored waveform. This ability is included as part of the present embodiment and would not necessarily be included in a commercial product.

The limiting factor as to how many points will be in the synthesized waveform has to do with component frequencies and octave shift capability. For example, assuming a 16 microsecond MBASE, then a non-octave shifted 32 point waveform requires a DNCK of 0.5 microsecond. A one octave upshift requires a DNCK of 0.25 microsecond, a 2 octave upshift requires DNCK to be 0.125 microsecond, and finally a 3 octave upshift requires the oscillator frequency with period of 0.0625 microseconds. From the preceding, it can be seen that going to a 64 point representation allows only 2 octave upshifts and a 128 point representation allows only one. For the present embodiment, the tradeoff was made to evaluate only 32 and 64 point waveforms. However, with the availability of reasonably priced circuits of ever higher frequency response, ever better waveform representations will be possible without compromising the octave shift feature.

There are three counter IC's shown at the center of FIG. 10. The top two stages 1200, 1210 perform the function of the address counter 570 of FIG. 5. The third counter IC stage 1220 performs the function of the second counting means 590 of FIG. 5. It makes 8 different wave tables effectively simultaneously available as follows:

Each time the upper two stages 1200, 1210 advance one count, the counter 1220, which is clocked at 5 microseconds, cycles through 8 states. Thus, at a 2 MHz rate, 8 different waveforms values for the synthesized point are made available at the output of the PROM 1230, 1240 and clocked into the latches (FIG. 10, right) The logic 1270 (FIG. 10, left) controls the sequencing of this operation. In order for this time division multiplexing technique to work there must simply be enough time between each of the 32 (or 64, or whatever) points for the multiple values at each point to be presented to subsequent circuits for their use.

For the embodiment shown, at each of the 32 points of the synthesized wave, 8 different waveform values are briefly made available for capture by up to 8 different D/A circuits, to be described below.

The state of eight voice selection switches 1280 (FIG. 10, left) is sequentially fed through a 74F151 selector 1281 driven by the voice select counter 1220. Thus, as each of the voice values is obtained from the PROM, a related switch is sampled to determine whether or not the user wants the addressed voice to go to the D/A subsystem.

The term "voice" as used here refers to a complete wave table stored In PROM.

If a particular voice is selected, the output of the 74F151 selector 1281 enables combinatorial logic 1290 to generate one or the other of the two clock signals CWR1(1291), or CWR2(1292) (FIG. 10, right). These clocks, in conjunction with the voice select counter state presented on CA0(1298) and CA1(1294) determine whether the PROM value will or will not be clocked into one of eight latched input D/A circuits. The circuits of 1280–1290 implement some of the functions of decode select logic 610 and selection switches 620 of FIG. 5.

On FIG. 10 (right) two PROMS 1250, 1260 are shown addressed in parallel. This means that up to 16 bits of amplitude data can be encoded for each of the addressed points. However, in this application, only bits 0–7 are used by the D/A converters. Practically, however, this configuration could drive 15 bit converters. The 16th bit is reserved for a special purpose.

The 16th bit has been programmed to be (low) true only when the stored waveforms are at their common zero crossing point. When this happens, the MOD signal 1261 causes the CWR1 and CWR2 strobes to be generated for all voices, user switch selected or not. The result is to clock the amplitude corresponding to waveform zero into every one of the subsequent D/A converters, thus "zeroing out" all those not user switch 1280 selected.

The MOD signal 1261 has another function. It is used as a timing signal to switch the setting of a digital attenuator that controls synthesizer output amplitude. By changing the attenuator only at zero crossings, the output waveform is not distorted by modulation products. (The product of 0 times anything equals 0.)

Figure 11:
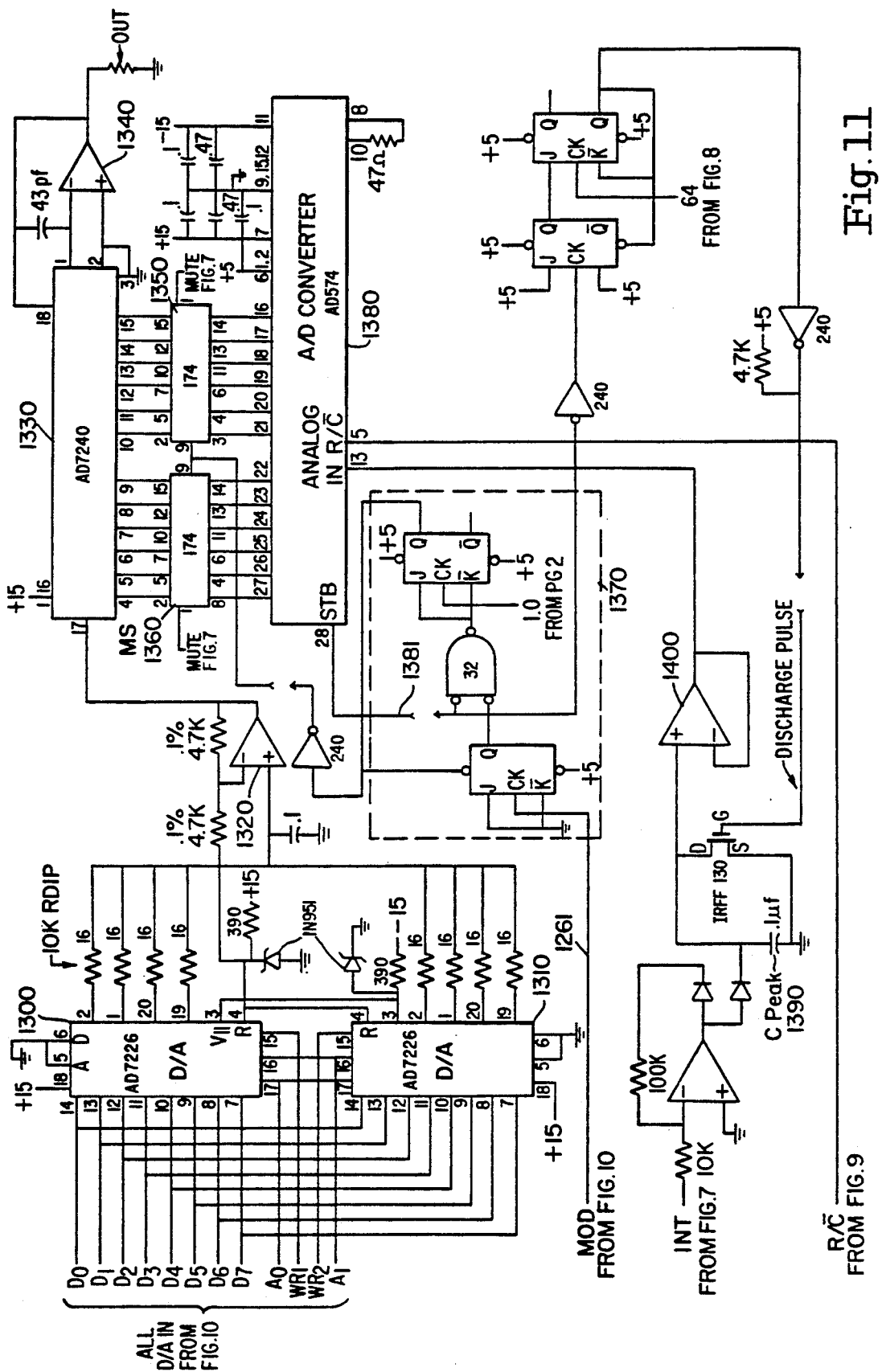

FIG. 11 shows the synthesized waveform output subsystem. Two AD7226 quad latched input D/A converters 1300, 1310 are at the upper left. These are loaded with the PROM values from FIG. 10.

The outputs of all eight converters of D/A converters 1300, 1310 are summed into an inverting amplifier 1320, which in turn drives the input of an AD7240 digital attenuator 1330. The attenuated output is buffered by an amplifier 1340 (FIG. 11, upper right) and can then be used to drive other amplifiers, filters, speakers, etc.

The AD7240 attenuator 1330 operates on a 12 bit input, where zero represents maximum attenuation and hex FFF represents minimum attenuation. The 12 bit input is held constant in two 74F174 latches 1350, 1360 during the entire output waveform cycle. The latches 1350, 1360 are updated from A/D 1380 by the MOD pulse 1261 output of the PROM 1260 on FIG. 10, at the output waveform zero crossing point.

Logic 1370 (FIG. 11) delays the latch update slightly in the event that the MOD pulse 1261 overlaps the conversion process during which converter 1380 output is not available (about 20 microseconds). This corresponds to delay circuit 700 on FIG. 5.

Timing of the AD574 converter 1380 (FIG. 11) is based on the R/C* pulse from FIG. 9. When R/C* is a logic high level, the output of converter 1380 is available to the 12 bit latch. When R/C* is logic low (for about one microsecond) conversion is initiated.

The R/C* pulse is generated at the end of the input waveform integration cycle. At that time the peak value of the integral for the preceding cycle will be available as a voltage stored on capacitor CPEAK 1390 (FIG. 11, lower left). This is the voltage that the AD574 converter 1380 will convert to control the output amplitude.

At the end of conversion, the conversion complete signal from the converter 1380 STS output 1381 will be used to generate a pulse to discharge capacitor CPEAK 1390 in preparation for the next input cycle's integral peak.

Although no ADSR (Attack, Decay, Sustain, Release) feature is employed in this embodiment of the invention, it should be clear to those versed in the art that providing a summing amplifier between the CPEAK buffer 1400 and the converter 1380 would allow the CPEAK value to be summed with, or selectively replaced by, an ADSR envelope.

Additional features of the invention are hereinafter disclosed.

Multi-Cycle Synthesis Feature

FIG. 10 shows an address counter addressing PROMS which contain stored wave shape tables. As previously disclosed, a single cycle of a wave comprises a table. However, it may also be desirable to store many cycles. For example, a wave may be reproduced with subharmonic or other multi-cycle effects by (assuming for example 64 stored points/cycle) extending the waveform address counter by the number of bits corresponding to the number of cycles desired. For example, if a two cycle sequence is desired, the counter 1200, 1210 would connect to A0 through A6 on the PROMS 1230, 1240 and the voice select lines of voice select counter 1220 if used would connect to A7 and up. If a nonbinary number of cycles is desired, one of the outputs can be assigned the task of resetting the cycle counter 1200, 1210 after the desired number of cycles. This is done by programming a reset pulse to appear on the selected prom output line and resetting the address counter 1200, 1210 with it. If two 8 bit PROMS 1230, 1240 were used, this would still leave 14 bits for amplitude information. See FIG. 5 for a block diagram showing this feature.

Other Multi-Cycle Features

It has been taught above how to have many simultaneously (in effect) accessed wave tables in one prom. One of the wave tables may be applied to a D/A which modulates the amplitude of the other waves in the table; for example as an ADSR (Attack, Decay, Sustain, Release) envelope generator. This would have the effect of keeping the ADSR wave in proportion to the frequency being synthesized.

Alternatively, the different waves could represent different chords that harmonize with the base note selected. Combining chord selection with appropriate programmed or external ADSR control, initiated by the leading edge of the envelope detector, provides the ability to simulate stringed instruments such as piano or guitar, in addition to wind and organ and also to simulate percussives. Again, see FIG. 5 for some of the block diagram functional embodiment approaches.

Dynamic Output Filtering Feature

When a waveform is constructed by means of a D/A, as in FIG. 11, that waveform will have Voltage step changes as the D/A output changes. It is the usual practice to eliminate these steps by passing the wave through a low pass filter. For example, the waveforms created by the FIG. 10 & 11 embodiment will have step changes at 32 or 64 times the basic frequency of the output wave. Thus, a simple low-pass filter should be able to do the job.

However, the situation is complicated by the fact that the basic frequency of the synthesized waveform might be shifted over many octaves. In such a case, a filter that was appropriate for the lowest octave would be inappropriate for the highest.

One solution to the filtering problem is dynamic output filtering; that is, filtering with the ability to dynamically change the location of the cutoff point.

Dynamic output filtering means, specifically related to the analyzer/synthesizer embodiment disclosed above, are:

a. Use of a switched capacitor filter, such as the Maxim Corporation 26X series (x=3-7), or equivalents. These devices implement low pass filters where the corner frequency of the filter is controlled by a clock into the device. The higher or lower the clock, the higher or lower the corner frequency. An ideal source of such clock would be the PROM CT signal 1111 at the lower right of FIG. 9.

b. Use of an RC lowpass filter where the "C" section is actually several capacitors parallel connected to the "R" on one side and connected to ground on the other side through switching means controlled by or part of the octave shift switch 940 (FIG. 8, left). As the switch is moved, the appropriate value of C is switched in or out. Additional other means, common in the art, would be included to insure that the switching transition would be "noiseless". Although this technique does not have the precision of the one described in the preceding paragraph a., it should be far less expensive and adequate for many applications.

c. An RC filter where the "R" element is a digitally controlled resistance, such as the AD7240, and the controlling value is taken from the binary representation of the octave select switch 940 (FIG. 8, left) position in appropriate summation with the value stored in the 12 bit register 1050, 1060 of FIG. 9. To achieve noiseless switching, "R" element update can be clocked by the MOD signal of FIG. 10.

Adaptive Points/Wave Feature

It is an objective of the prototype embodiment to demonstrate the ability to synthesize waves with approximately the same level of fidelity as commercial digital audio. This would imply 16 bit amplitude resolution and an approximately 44 kHz "sampling" rate. As shown on FIG. 10, 15 bit resolution could be achieved if appropriate commercial 16 bit D/A devices are employed, and there is no technical reason that 16 bits also could not be had at the cost of another PROM for the 16th bit.

"Sampling rate" equivalence can be achieved, although not fully accomplished in the prototype embodiment disclosed above, as follows.

To compare digital audio to the demonstrated synthesizer operating at 64 points per output wave, divide the digital audio sampling rate of 44 kHz by 64=687.5. This means that at frequencies above 687.5 Hz, a 64 point representation has better sampling rate fidelity than digital audio. It is oversampled. But below that frequency it is worse; undersampled. To be comparable to digital audio, the number of points required per single cycle wave are given in the table below:

| NUMBER OF POINTS | FREQUENCY FOR SAMPLING EQUIVALENCE |
|---|---|
| 64 | 687.5 |
| 128 | 343.75 |
| 256 | 171.875 |
| 512 | 85.9375 |

Commercially available PROMS can readily store the number of points required. However, as the number of points rises, the octave shift feature is compromised. One way around this is with a dynamic wave table selection mechanism. The necessary means (using 85.9375 and the disclosed 64 point embodiment as an example) are:

a. A PROM with four wave tables for each waveform. Although the wave in each table could be basically the same, each table would show it in more detail than the preceding; i.e. 64, 128, 256 and 512 points.

b. Logic to determine the user desired output base frequency by sensing both the octave shift control and the measured f0.

c. A barrel shifter located between the 12 bit register 540 of FIG. 5 and 12 bit counter 1050, 1060 of FIG. 9, capable of shifting the number in the register to the right under control of the logic that sense desired output frequency.

As an example of how the above works, if the desired frequency output detection logic determined the desired frequency to be approximately between 85 and 171 Hz, it would set the barrel shifter to shift right 3 places, increasing the prom address counter advance rate by 8 times. It would also address the appropriate higher order bits of the PROM to access the 512 point table.

Although the 85 and 171 Hz entries from the above table have been used in this example, use of other numbers relatively close might be easier to implement.

The above illustrative example shows how sampling parity could be obtained with respect to commercial digital audio. However, the technique could be extended to provide oversampling at all frequencies of interest. The advantage of oversampling being simplification of the output filter requirements for wave accuracy.

Wave Table Management Features

Although PROM based wave tables have been referred to, various other memory options are open to those skilled in the art for adaptation here, such as replacing PROM with battery backed up RAM, replaceable PROM cartridges and RAM downloaded from computer or other sources, all of which can be used for loading and/or changing wave tables prior to use or during use.

Frequency to Digital Subsystem (F/D) Feature

A subsystem of the disclosed analyzer/synthesizer embodiment of the invention is adaptable for use as an f/d component in a variety of systems. The subsystem is comprised of at least:

1. The basic integrator, two comparators and logic (see FIG. 3 or 7) which form the f0 detector and 2. A sequencer, up counter and register, as shown on FIG. 5, where the register output is tri-state and counter and register are any desired number of bits, and the up count clock is internally or externally supplied and 3. The sequencer is modified so as to produce a pulse subsequent to loading the register from the counter.

The above elements, which are amenable to integration on a single chip, form an f/d subsystem whose inputs would be the frequency to be measured, a count clock and a tri-state enable. Its outputs would consist of a pulse, suitable for use as a processor interrupt and a tristate parallel binary representation of the measured f0.

Integral Measurement Subsystem Feature

A by-product of the above F/D subsystem is an integral measurement subsystem. To achieve this it is only necessary to capture the peak value of the integral, digitize it and store it in digital form for reading by a processor.

Pitch Trainer/Instrument Tuner Feature

A pitch trainer or instrument tuner may be readily constructed using the f/d subsystem in conjunction with a microprocessor or other logic means which does any or all of the following: (1) Input the frequency measurement. (2) Determine and display in musical notation (A, A#, etc.) the nearest whole note. (3) Display the direction and magnitude of the difference between the input note and the nearest whole note, using analog means (for example a lighted bar up or down from a centerline, with length proportional to difference. Or display the input note value in Hz, the nearest whole note value in Hz and the difference in Hz. Since immediate feedback is the most important thing in biofeedback training, it is believed that the pitch trainer subsystem will be extremely effective. In addition, with the use of suitable pickup means the same core components can form an instrument tuning indicator.

f0 Detector Modem Front End Feature

Signals between modems in common use employ frequency shift keying, where one frequency represents a digital "1" and the other represents a digital "0" (or mark and space). The f0 detector invention is ideally suited for use in such modems because of its ability to capture every cycle of the input frequency and change it to a digital representation. It also makes multi-frequency frequency shifts encoding possible, where each different frequency represents a binary word and a word can be transmitted with a single cycle of the corresponding frequency.

Accordingly, the objects of the invention in the introduction to this specification have been accomplished as well as the advantages by the embodiments and features of the invention disclosed. Other objects and advantages of the invention will be apparent to those skilled in the art.

The following claims are part of this specification and disclose other features of the invention.

What is claimed is:

1. A process for detecting the fundamental frequency of each cycle of a series of contiguous cycles of an alternating current input wave from an alternating current source, wherein each sequential cycle in the series is treated as the current cycle, and the following contiguous cycle is treated as the succeeding cycle, comprising the steps of:

(A) starting to integrate the amplitudes of the current cycle of the input wave when the amplitude of the input wave exceeds a given amplitude in a given polarity;

(B) continuing to integrate the amplitudes of the current cycle of the input wave for a first given period of time which is less than the shortest expected wave period being detected and during said first period of time ignoring the value of the integral;

(C) continuing to integrate the amplitudes of the current cycle of the input wave for a second period of time until the value of the integral reaches a threshold voltage set above the highest expected end of cycle value of the integral;

(D) resetting and maintaining the value of the integral at said starting value prior to the input wave again reaching said given amplitude in said given polarity; and (E) again starting to integrate the amplitudes of the input wave when the amplitude of the succeeding cycle of the input wave exceeds said given amplitude in said given polarity;

(F) measuring the time between any given event in the steps (A) through (D) for the current cycle and the corresponding event in the steps (A) through (D) for the succeeding cycle, whereby said measured time represents the period of the fundamental frequency; and (G) dividing one by the period of the fundamental frequency to obtain the fundamental frequency.

2. A system for detecting the fundamental frequency of each cycle of a series of cycles of an alternating current input wave from an alternating current source, wherein each sequential cycle in the series is treated in what follows as the current cycle, and the following contiguous cycle is treated as the succeeding cycle, comprising:

(A) threshold sensing means responsive to the beginning of a current cycle of the input wave for sensing when the input wave exceeds a given amplitude in a given polarity;

(B) integrator means responsive to said threshold sensing means during said current cycle of the input wave for
 (1) starting to integrate the amplitudes of the current cycle of the input wave when the amplitude of the input wave exceeds said given amplitude in a given polarity, said integration thereby starting from a predetermined integrator means reset value, and
 (2) continuing to integrate the amplitudes of the current cycle of the input wave for a first given period of time which is less than the shortest expected input wave period and during said first period of time ignoring the value of the integral until at least it departs from said predetermined integrator means reset value;

(C) comparator means for comparing the value of the integral with a reference value above the highest expected end of cycle value of the integral;

(D) said integrator means continuing to integrate the amplitudes of the current cycle of the input wave during said current cycle of the input wave for a second period of time until said comparator means determines that the value of the integral is insubstantially different from said reference value;

(E) reset means responsive to said comparator means during the current cycle of the input wave for resetting said integrator means to said predetermined integrator means reset value prior to the input wave again reaching said given amplitude in said given polarity;

(F) measuring means for measuring the time between a given event in the system during a current cycle of the input wave and the corresponding event in the system during the succeeding cycle to determine the period of the fundamental frequency of a cycle of the input wave; and (G) dividing means for dividing one by the period of the fundamental frequency to obtain the fundamental frequency.

3. A system for detecting the fundamental frequency of each cycle of a series of cycles of an alternating current input wave from an alternating current source, wherein each sequential cycle in the series is treated as the current cycle, and the following contiguous cycle is treated as the succeeding cycle, comprising:

(A) threshold sensing means responsive to the beginning of a current cycle of the input wave for sensing when the input wave exceeds a given amplitude in a given polarity;

(B) integrator means responsive to said threshold sensing means during said current cycle of the input wave for
 (1) starting to integrate the amplitudes of the current cycle of the input wave when the amplitude of the input wave exceeds said given amplitude in a given polarity, said integration thereby starting from a predetermined integrator means reset value, and
 (2) continuing to integrate the amplitudes of the current cycle of the input wave for a first given period of time which is less than the shortest expected input wave period and during said first period of time ignoring the value of the integral until at least it departs from said predetermined integrator means reset value;

(C) comparator means for comparing the value of the integral with said predetermined integrator means reset value during said current cycle of the input wave;

(D) said integrator means continuing to integrate the amplitudes of the current cycle of the input wave during said current cycle of the input wave for a second period of time until said comparator means determines that the value of the integral is insubstantially different from said predetermined integrator means reset value;

(E) reset means responsive to said comparator means during the current cycle of the input wave for resetting said integrator means to said predetermined integrator means reset value prior to the input wave again reaching said given amplitude in said given polarity;

(F) measuring means for measuring the time between a given event in the system during a current cycle of the input wave and the corresponding event in the system during the succeeding cycle to determine the period of the fundamental frequency of a cycle of the input wave; and (G) dividing means for dividing one by the period of the fundamental frequency to obtain the fundamental frequency.

4. A system for detecting the fundamental frequency of an alternating current input wave according to claim 3 wherein said given event during the current cycle and the corresponding event during the succeeding cycle is the start of integration by the integration means.

5. A system for detecting the fundamental frequency of an alternating current input wave according to claim 3 wherein said given event during the current cycle and the corresponding event during the succeeding cycle is detection by the threshold sensing means, at such time as said integrator means is reset, that the input has exceeded said given amplitude in a given polarity.

6. A system for detecting the fundamental frequency of an alternating current input wave according to claim 3 wherein said given event in the current cycle and the corresponding event in the succeeding cycle is the end of the integration period as determined by said comparator means.

7. A system for detecting the fundamental frequency of an alternating current input wave according to claim 3 further comprising voltage addition means for adding to the input wave a small but sufficient amount of voltage of a polarity opposite that of said given polarity such that the integral accumulated by said integrator means will always return to said value which is insubstantially different from the value it had when integration started prior to the end of the current cycle being detected.

8. A system for detecting the fundamental frequency of an alternating current input wave according to claim 3 wherein said given amplitude in a given polarity is greater than the noise of said given polarity inherent in said alternating current source.

9. A system for detecting the fundamental frequency of an alternating current input wave according to claim 3 further comprising signal sensing means for sensing if the source of the alternating current input wave has no signal present with an amplitude in excess of said given amplitude in a given polarity for a given minimum period of time.

10. A system for detecting the fundamental frequency of an alternating current input wave according to claim 3 further comprising signal sensing means for terminating the detection of the fundamental frequency when the source of the alternating current input wave has no signal present with an amplitude in excess of said given amplitude in a given polarity for a given minimum period of time.

11. A system for detecting the fundamental frequency of an alternating current input wave according to claim 3 further comprising peak storage means for storing the peak value of the integral of the input wave for each cycle.

12. A system for detecting the fundamental frequency of an alternating current input wave according to claim 3 wherein said time measurement means comprises oscillator means having a frequency substantially higher than the highest expected fundamental frequency, counting means responsive to said oscillator means for counting the number of oscillations between a given event in a current cycle and the corresponding given event in the succeeding cycle, and multiplying means responsive to said counting means for multiplying such count by the oscillator period to obtain the period of the fundamental frequency of the input wave.

13. A system for detecting the fundamental frequency of an alternating current input wave according to claim 12 further comprising:
(A) storage means responsive to said counting means for storing a count at each said given event;
(B) counter reset means coupled to said counting means for resetting said counting means immediately subsequent to storing a count;
(C) whereby said stored count is proportional to the period of the current cycle of the input wave.

14. The system for detecting the fundamental frequency of an alternating current input wave of claim 13 wherein said counter reset means also generates a new count pulse which indicates that a new count proportional to the period of the current cycle is stored.

15. A system for detecting the fundamental frequency of an alternating current input wave according to claim 14 further comprising computer means, responsive to said storage means storing said count corresponding to said period of the input wave and to said new count pulse, for converting said stored count into the corresponding fundamental frequency, and display means responsive to said computer means for displaying the fundamental frequency of the input wave.

16. A system for detecting the fundamental frequency of an alternating current input wave according to claim 15 wherein said display means displays the fundamental frequency in digital representation.

17. A system for detecting the fundamental frequency of an alternating current input wave according to claim 15 wherein said display means displays the fundamental frequency in analog representation.

18. A system for detecting the fundamental frequency of an alternating current input wave according to claim 15 wherein said computer means calculates and said display means displays the difference between the fundamental frequency and a predetermined expected fundamental frequency.

19. A system for detecting the fundamental frequency of an alternating current input wave according to claim 18 wherein said display means displays said difference frequency in digital representation.

20. A system for detecting the fundamental frequency of an alternating current input wave according to claim 18 wherein said display means displays sad difference frequency in analog representation.

21. A system for detecting the fundamental frequency of an alternating current input wave according to claim 15 wherein said computer means calculates and said display means displays a scaled fundamental frequency.

22. A system for detecting the fundamental frequency of an alternating current input wave according to claim 21 wherein said fundamental frequency display means displays said scaled frequency in digital representation.

23. A system for detecting the fundamental frequency of an alternating current input wave according to claim 3 further comprising a microphone in contact with a person for the purpose of sensing sounds generated by that person for generating said input wave.

24. A system for detecting the fundamental frequency of an alternating current input wave according to claim 23 wherein said contact with the person for the purpose of sensing sounds generated by that person is by a microphone in contact with that person, wherein any vocal cord originated sounds sensed thereby are inverted by amplifying means so that the fixed polarity peak which is always at the start of a vocal cord cycle is of the same polarity as that of the given threshold for starting integration.

25. A system for detecting the fundamental frequency of an alternating current input wave according to claim 23 wherein said contact with the person for the purpose of sensing sounds generated by that person is by the microphone touching the lips of the person to sense vocal cord sounds for generating said input wave.

26. A system for detecting the fundamental frequency of an alternating current input wave according to claim 23 wherein said contact with the person for the purpose of sensing sounds generated by that person is by the microphone touching the throat of the person to sense vocal cord sounds for generating said input wave.

27. A system for detecting the fundamental frequency of an alternating current input wave according to claim 23 wherein said contact with the person for the purpose of sensing sounds generated by that person is by the microphone touching the head of the person to sense vocal cord sounds for generating said input wave.

28. A system for detecting the fundamental frequency of an alternating current input wave according to claim 3 further comprising a signal source for generating said input wave.

29. A system for detecting the fundamental frequency of an alternating current input wave according to claim 28 wherein said signal source is an audio waveform generating means.

30. A system for detecting the fundamental frequency of an alternating current input wave according to claim 28 wherein said signal source is an electronic waveform generating means.

31. A system for detecting the fundamental frequency of an alternating current input wave according to claim 28 wherein said signal source is a musical instrument.

32. A system for detecting the fundamental frequency of a cycle of an alternating current input wave according to claim 3 further comprising converting means for converting the fundamental frequency to a note on the musical scale by a given algorithm.

33. A system for detecting the fundamental frequency of a cycle of an alternating current input wave according to claim 3 further comprising table lookup means for converting the fundamental frequency to a note on the musical scale.

34. A system for detecting the fundamental frequency of a cycle of an alternating current input wave according to claim 3 further comprising display means for displaying the fundamental frequency in cycles/second.

35. A system for detecting the fundamental frequency of a cycle of an alternating current input wave according to claim 3 further comprising display means for displaying the fundamental frequency in musical notation.

36. A system for detecting the fundamental frequency of a cycle of an alternating current input wave according to claim 3 further comprising difference display means for displaying the difference between the measured note and the nearest note on the musical scale.

37. A system for detecting the fundamental frequency of a cycle of an alternating current input wave according to claim 3 wherein the displayed difference between the measured note and the nearest note on the musical scale is a number.

38. A system for detecting the fundamental frequency of a cycle of an alternating current input wave according to claim 3 wherein the displayed difference between the measured note and the nearest note on the musical scale is an analog representation.

39. A system for detecting the fundamental frequency of a cycle of an alternating current input wave according to claim 3 further comprising a microphone in contact with a person's skin as the source of the alternating current input wave for determining the fundamental frequency.

40. A system for detecting the fundamental frequency of an alternating current input wave according to claim 3 further comprising peak detection means responsive to said integrator means for detecting and storing the peak amplitude of the value of the integral.

41. A system for detecting the fundamental frequency of an alternating current input wave according to claim 40 further comprising pulse generating means responsive to said integrator means for generating an end pulse when the value of the integral is insubstantially different from said predetermined integrator means reset value.

42. A system for detecting the fundamental frequency of an alternating current input wave according to claim 41 further comprising reset means responsive to said end pulse and coupled to said peak detection means for generating a reset pulse for resetting said peak detection means to a given reset value after a predetermined delay and prior to the next peak amplitude of the value of the integral.

43. A system for detecting the fundamental frequency of an alternating current input wave according to claim 42 further comprising analog to digital conversion means responsive to said peak detection means for converting the stored peak amplitude to a corresponding digital representation.

44. A system for detecting the fundamental frequency of an alternating current input wave according to claim 43 wherein the analog to digital conversion occurs subsequent to said end pulse and prior to said reset pulse.

45. A system for detecting the fundamental frequency of an alternating current input wave according to claim 43 further comprising indicating means responsive to said analog to digital conversion means for indicating the converted peak value of the integral in digital form.

46. A process for detecting the period of the fundamental frequency of a single cycle of an alternating current waveform from an alternating current source comprising the steps of:

(A) changing the value of an output variable upon detection of a departure from a zero value of the alternating current waveform, and thereafter ignoring further departures from subsequent zero values of the alternating current waveform;

(B) starting to integrate the amplitudes of the alternating current waveform cycle when the amplitude of the alternating current waveform exceeds a given amplitude;

(C) continuing thereafter to integrate the amplitudes of the alternating current waveform for a first given period of time which is less than the shortest expected alternating current waveform cycle and during said first given period of time ignoring the value of the integral;

(D) continuing thereafter to integrate the amplitudes of the alternating current waveform cycle until the value of the integral is insubstantially different from its value when the integration started;

(E) waiting thereafter until occurrence of a zero value of the alternating current waveform, and thereupon changing the value of an output variable;

(F) whereby the period of the output variable changes represents the detected period of the input cycle of an alternating current waveform from an alternating current source.

47. A process for detecting the period of the fundamental frequency of a single cycle of an alternating current waveform from an alternating current source according to claim 46 further comprising determining the period of the fundamental frequency of a cycle of an alternating current waveform by measuring the time between output variable changes which measured time is the period of the cycle.

48. A process for detecting the period of the fundamental frequency of a single cycle of an alternating current waveform from an alternating current source according to claim 47 further comprising the step of determining the fundamental frequency of a cycle of an alternating current waveform by dividing one by the period.

49. A process for detecting the fundamental frequency of each cycle of a series of contiguous cycles of an alternating current input wave from an alternating current source, wherein each sequential cycle in the series is treated as the current cycle, and the following contiguous cycle is treated as the succeeding cycle, comprising the steps of:

(A) starting to integrate the amplitudes of the current cycle of the input wave when the amplitude of the input wave exceeds a given amplitude in a given polarity;

(B) continuing to integrate the amplitudes of the current cycle of the input wave for a first given period of time which is less than the shortest expected wave period being detected and during said first period of time ignoring the value of the integral;

(C) continuing to integrate the amplitudes of the current cycle of the input wave for a second period of time until the value of the integral is insubstantially different from its value when the integration started in step (A);

(D) maintaining the value of the integral at said starting value prior to the input wave again reaching said given amplitude in said given polarity; and (E) repeating steps (A) through (D) for the succeeding cycle of the input wave;

(F) measuring the time between any given event in the steps (A) through (D) for the current cycle and the corresponding event in the step (A) through (D) for the succeeding cycle, whereby said measured time represents the period of the fundamental frequency; and (G) dividing one by the period of the fundamental frequency to obtain the fundamental frequency.

50. A process for detecting the fundamental frequency of a cycle of an alternating current input wave according to claim 49, whereby the time between the start of integration on the current cycle and the corresponding event for the succeeding cycle represents the period of the fundamental frequency.

51. A process for detecting the fundamental frequency of a cycle of an alternating current input wave according to claim 49, whereby the time between when the amplitude of the input wave exceeds a given amplitude in a given polarity in the current cycle and the corresponding event for the succeeding cycle represents the detected period of the fundamental frequency.

52. A process for detecting the fundamental frequency of a cycle of an alternating current input wave according to claim 49, whereby the time between the end of integration in the current cycle and the corresponding event for the succeeding cycle represents the detected period of the fundamental frequency.

53. A process for detecting the fundamental frequency of a cycle of an alternating current input wave according to claim 49, wherein the integral always returns to said value which is insubstantially different from the value it had when integration started prior to the end of the current cycle because of the addition to the input wave of a voltage of a polarity opposite that of said given polarity which added voltage is set to a magnitude in excess of the worst case sum of all integrator error voltages of said given polarity.

54. A process for detecting the fundamental frequency of a cycle of an alternating current input wave according to claim 49 further comprising the step of changing a binary process indicator from a binary state representing signal to a binary state representing no signal when the source of the alternating current input wave has no signal present with an amplitude in excess of noise inherent in said alternating current source for a given minimum period of time.

55. A process for detecting the fundamental frequency of a cycle of an alternating current input wave according to claim 49 further comprising the step of storing the peak value of the integral of the input wave for each cycle.

56. A process for determining the fundamental frequency of a cycle of an alternating current input wave according to claim 49 wherein the fundamental frequency is converted to a musical note representation by a given algorithm.

57. A process for determining the fundamental frequency of a cycle of an alternating current input wave according to claim 49 wherein the fundamental frequency is converted to a musical note by a table lookup.

58. A process for determining the fundamental frequency of a cycle of an alternating current input wave according to claim 49 further comprising the step of displaying the fundamental frequency in cycles/second.

59. A process for determining the fundamental frequency of a cycle of an alternating current input wave according to claim 49 further comprising the step of displaying the fundamental frequency in musical notation.

60. A process for determining the fundamental frequency of a cycle of an alternating current input wave according to claim 49 further comprising the step of displaying the difference between said fundamental frequency and the nearest musical scale note value.

61. A process for determining the fundamental frequency of a cycle of an alternating current input wave according to claim 49 further comprising the step of displaying the difference between said fundamental frequency and the nearest musical scale note as a number.

62. A process for determining the fundamental frequency of a cycle of an alternating current input wave according to claim 49 further comprising the step of displaying the difference between said fundamental frequency and the nearest note on the musical scale by analog representation.

63. A process for determining the fundamental frequency of a cycle of an alternating current input wave according to claim 49 further comprising the step of displaying the difference between the detected frequency and a reference frequency.

64. A process for determining the fundamental frequency of a cycle of an alternating current input wave according to claim 49 wherein the source of the alternating current input wave is a microphone in contact with a person's skin.

65. The process of claim 1, wherein the measurement of time between an event in the current cycle and the corresponding event in the succeeding cycle is performed by counting the number of oscillations of an oscillator between corresponding events, with the oscillator frequency substantially higher than the highest expected fundamental frequency, and multiplying such count by the oscillator period to obtain the period of the fundamental frequency of the input wave.

66. A process for detecting the fundamental frequency of a cycle of an alternating current input wave according to claim 1 further comprising the step of terminating the process when the source of the alternating current input wave has no signal present with an amplitude in excess of noise inherent in said alternating current source for a given minimum period of time.

67. A process for detecting the fundamental frequency of a cycle of an alternating current input wave according to claim 1 wherein said given amplitude in a given polarity is greater than any noise of said given polarity inherent in said alternating current source.

68. A process for determining the period of the fundamental frequency of a signal having an amplitude variation with respect to a predetermined variable for a portion of the signal having a waveform for which the integral of the amplitude of the waveform relative a predetermined reference level is substantially zero, said process comprising the steps of:

(A) integrating the amplitude of said waveform with respect to said predetermined variable to produce a related integration value, said integration starting from a first value of said predetermined variable at which said waveform has an amplitude substantially equal to a predetermined amplitude;

(B) selecting a second value of said predetermined variable using said first value, said second value functioning as a reference value for establishing a full cycle of the fundamental frequency;

(C) comparing said related integration value of the integral obtained in step (A) to a predetermined integration value; and (D) using the information in step (C) to obtain a third value of said variable corresponding to a point on said waveform spaced apart from said second value by an amount approximately equal to the full cycle of the fundamental frequency;

whereby the period of the fundamental frequency of said waveform is determined.

69. The process of claim 68, wherein said step (B) comprises setting said second value substantially equal to said first value.

70. The process of claim 69, wherein said signal comprises a plurality of contiguous waveforms and said steps (A), (B), (C), and (D) are applied successively to each waveform independently of the other waveforms.

71. The process of claim 68, wherein said step (B) comprises the steps of determining the closest signal zero relative said reference level preceding said first value and using the value of the predetermined variable corresponding to said signal zero for said second value.

72. The process of claim 71, wherein said signal comprises a plurality of contiguous waveforms and said steps (A), (B), (C), and (D) are applied successively to each waveform independently of the other waveforms.

73. The process of claim 68, wherein said step (D) comprises the step of setting said third value substantially equal to the value of said predetermined variable corresponding to the related integration value substantially equalling the value of said predetermined integration value.

74. The process of claim 73, wherein said signal comprises a plurality of contiguous waveforms and said steps (A), (B), (C), and (D) are applied successively to each waveform independently of the other waveforms.

75. The process of claim 68, wherein said step (D) comprises the steps of determining the closest signal zero relative said reference level following the occurrence of said related integration value being substantially equal to said predetermined integration value and using the value of the predetermined variable corresponding substantially to said signal zero for said third value.

76. The process of claim 75, wherein said signal comprises a plurality of contiguous waveforms and said steps (A), (B), (C), and (D) are applied successively to each waveform independently of the other waveforms.

77. The process of claim 68, wherein said signal comprises a plurality of contiguous waveforms and said steps (A), (B), (C), and (D) are applied successively to each waveform independently of the other waveforms.

78. A system for determining the period of the fundamental frequency of a signal having an amplitude variation with respect to a predetermined variable for a portion of the signal having a waveform for which the integral of the amplitude of the waveform relative a predetermined reference level is substantially zero, said system comprising:

(A) integrating means operable for integrating the amplitude of said waveform with respect to said predetermined variable to produce a related integration value, said integration starting from a first value of said predetermined variable at which said waveform has an amplitude substantially equal to a predetermined amplitude;

(B) selecting means operable for selecting a second value of said predetermined variable using said first value, said second value functioning as a reference value for establishing a full cycle of the fundamental frequency;

(C) comparing means operable for comparing said related integration value of the integral obtained with said integrating means to a predetermined integration value; and (D) processing means operable for using the information obtained from said comparing means to obtain a third value of said variable corresponding to a point on said waveform spaced apart from said second value by an amount approximately equal to the full cycle of the fundamental frequency;

whereby the period of the fundamental frequency of said waveform is determined.

79. The system of claim 78, wherein said selecting means comprises setting said second value substantially equal to said first value.

80. The system of claim 79, wherein said signal comprises a plurality of contiguous waveforms and all of said means are applied successively to each waveform independently of the other waveforms.

81. The system of claim 78, wherein said selecting means comprises determining the closest signal zero relative said reference level preceding said first value and using the value of the predetermined variable corresponding to said signal zero for said second value.

82. The system of claim 81, wherein said signal comprises a plurality of contiguous waveforms and all of said means are applied successively to each waveform independently of the other waveforms.

83. The system of claim 78, wherein said processing means comprises setting said third value substantially equal to the value of said predetermined variable corresponding to the related integration value substantially equalling the value of said predetermined integration value.

84. The system of claim 83, wherein said signal comprises a plurality of contiguous waveforms and all of said means are applied successively to each waveform independently of the other waveforms.

85. The system of claim 78, wherein said processing means comprises determining the closest signal zero relative said reference level following the occurrence of said related integration value being substantially equal to said predetermined integration value and using the value of the predetermined variable corresponding substantially to said zero crossing for said third value.

86. The system of claim 85, wherein said signal comprises a plurality of contiguous waveforms and all of said means are applied successively to each waveform independently of the other waveforms.

87. The system of claims 78, wherein said signal comprises a plurality of contiguous waveforms and all of said means are applied successively to each waveform independently of the other waveforms.

88. A process for detecting the period of the fundamental frequency of each cycle of a series of contiguous cycles of an alternating current input wave from an alternating current source, wherein each sequential cycle in the series is treated as the current cycle, and the following contiguous cycle is treated as the succeeding cycle, comprising the steps of:
   (A) starting to integrate the amplitudes of the current cycle of the input wave when the amplitude of the input wave exceeds a given amplitude in a given polarity;
   (B) continuing to integrate the amplitudes of the current cycle of the input wave for a first given period of time which is less than the shortest expected wave period being detected and during said first period of time ignoring the value of the integral;
   (C) continuing to integrate the amplitudes of the current cycle of the input wave for a second period of time until the value of the integral is insubstantially different from its value when the integration started in step (A);
   (D) maintaining the value of the integral at said starting value prior to the input wave again reaching said given amplitude in said given polarity;
   (E) repeating steps (A) through (D) for the succeeding cycle of the input wave; and
   (F) measuring the time between any given event in the steps (A) through (D) for the current cycle and the corresponding event in the steps (A) through (D) for the succeeding cycle, whereby said measured time represents the period of the fundamental frequency.

89. A process for detecting the period of the fundamental frequency of each cycle of a series of contiguous cycles of an alternating current input wave from an alternating current source, wherein each sequential cycle in the series is treated as the current cycle, and the following contiguous cycle is treated as the succeeding cycle, comprising the steps of:
   (A) starting to integrate the amplitudes of the current cycle of the input wave when the amplitude of the input wave exceeds a given amplitude in a given polarity;
   (B) continuing to integrate the amplitudes of the current cycle of the input wave for a first given period of time which is less than the shortest expected wave period being detected and during said first period of time ignoring the value of the integral;
   (C) continuing to integrate the amplitudes of the current cycle of the input wave for a second period of time until the value of the integral reaches a threshold voltage set above the highest expected end of cycle value of the integral;
   (D) resetting and maintaining the value of the integral at said starting value prior to the input wave again reaching said given amplitude in said given polarity; and
   (E) again starting to integrate the amplitudes of the input wave when the amplitude of the succeeding cycle of the input wave exceeds said given amplitude in said given polarity; and
   (F) measuring the time between any given event in the steps (A) through (D) for the current cycle and the corresponding event in the steps (A) through (D) for the succeeding cycle, whereby said measured time represents the period of the fundamental frequency.

90. A system for detecting the period of the fundamental frequency of each cycle of a series of cycles of an alternating current input wave from an alternating current source, wherein each sequential cycle in the series is treated as the current cycle, and the following contiguous cycle is treated as the succeeding cycle, comprising:
   (A) threshold sensing means responsive to the beginning of a current cycle of the input wave for sensing when the input wave exceeds a given amplitude in a given polarity;
   (B) integrator means responsive to said threshold sensing means during said current cycle of the input wave for
      (1) starting to integrate the amplitudes of the current cycle of the input wave when the amplitude of the input wave exceeds said given amplitude in a given polarity, said integration thereby starting from a predetermined integrator means reset value, and
      (2) continuing to integrate the amplitudes of the current cycle of the input wave for a first given period of time which is less than the shortest expected input wave period and during said first period of time ignoring the value of the integral until at least it departs from said predetermined integrator means reset value;
   (C) comparator means for comparing the value of the integral with said predetermined integrator means reset value during said current cycle of the input wave;
   (D) said integrator means continuing to integrate the amplitudes of the current cycle of the input wave during said current cycle of the input wave for a second period of time until said comparator means determines that the value of the integral is insubstantially different from said predetermined integrator means reset value;
   (E) reset means responsive to said comparator means during the current cycle of the input wave for resetting said integrator means to said predetermined integrator means reset value prior to the input wave again reaching said given amplitude in said given polarity; and
   (F) measuring means for measuring the time between a given event in the system during a current cycle of the input wave and the corresponding event in the system during the succeeding cycle to determine the period of the fundamental frequency of a cycle of the input wave.

91. A system for detecting the fundamental frequency of each cycle of a series of cycles of an alternating current input wave from an alternating current source, wherein each sequential cycle in the series is treated in what follows as the current cycle, and the following contiguous cycle is treated as the succeeding cycle, comprising:
   (A) threshold sensing means responsive to the beginning of a current cycle of the input wave for sensing when the input wave exceeds a given amplitude in a given polarity;
(B) integrator means responsive to said threshold sensing means during said current cycle of the input wave for
  (1) starting to integrate the amplitudes of the current cycle of the input wave when the amplitude of the input wave exceeds said given amplitude in a given polarity, said integration thereby starting from a predetermined integrator means reset value, and
  (2) continuing to integrate the amplitudes of the current cycle of the input wave for a first given period of time which is less than the shortest expected input wave period and during said first period of time ignoring the value of the integral until at least it departs from said predetermined integrator means reset value;
(C) comparator means for comparing the value of the integral with a reference value above the highest expected end of cycle value of the integral;
(D) said integrator means continuing to integrate the amplitudes of the current cycle of the input wave during said current cycle of the input wave for a second period of time until said comparator means determines that the value of the integral is insubstantially different from said reference value;
(E) reset means responsive to said comparator means during the current cycle of the input wave for resetting said integrator means to said predetermined integrator means reset value prior to the input wave again reaching said given amplitude in said given polarity; and
(F) measuring means for measuring the time between a given event in the system during a current cycle of the input wave and the corresponding event in the system during the succeeding cycle to determine the period of the fundamental frequency of a cycle of the input wave.

92. A process for detecting the period of the fundamental frequency of each cycle of a series of contiguous cycles of an alternating current input wave from an alternating current source, wherein each sequential cycle in the series is treated as the current cycle, and the following contiguous cycle is treated as the succeeding cycle, comprising the steps of:
(A) starting to integrate the amplitudes of the current cycle of the input wave when the amplitude of the input wave exceeds a given amplitude in a given polarity;
(B) continuing to integrate the amplitudes of the current cycle of the input wave for a first given period of time which is less than the shortest expected wave period being detected and during said first period of time ignoring the value of the integral;
(C) continuing to integrate the amplitudes of the current cycle of the input wave for a second period of time until the value of the integral is insubstantially different from its value when the integration started in step (A);
(D) repeating steps (A) through (C) for the succeeding cycle of the input wave;
(E) whereby the period of repetition of the process (A) through (C) is synchronized with the period of the fundamental frequency of the current cycle of the input wave, said period of repetition being the detected period of the fundamental frequency of the input wave.

93. A process for detecting the period of the fundamental frequency of each cycle of a series of contiguous cycles of an alternating current input wave from an alternating current source, wherein each sequential cycle in the series is treated as the current cycle, and the following contiguous cycle is treated as the succeeding cycle, comprising the steps of:
(A) starting to integrate the amplitudes of the current cycle of the input wave when the amplitude of the input wave exceeds a given amplitude in a given polarity;
(B) continuing to integrate the amplitudes of the current cycle of the input wave for a first given period of time which is less than the shortest expected wave period being detected and during said first period of time ignoring the value of the integral;
(C) continuing to integrate the amplitudes of the current cycle of the input wave for a second period of time until the value of the integral reaches a threshold voltage set above the highest expected end of cycle value of the integral;
(D) again starting to integrate the amplitudes of the input wave when the amplitude of the succeeding cycle of the input wave exceeds said given amplitude in said given polarity;
(E) whereby the period of repetition of the process (A) through (C) is synchronized with the period of the fundamental frequency of the current cycle of the input wave, said period of repetition being the detected period of the fundamental frequency of the input wave.

94. A system for detecting the period of the fundamental frequency of each cycle of a series of cycles of an alternating current input wave from an alternating current source, wherein each sequential cycle in the series is treated as the current cycle, and the following contiguous cycle is treated as the succeeding cycle, comprising:
(A) threshold sensing means responsive to the beginning of a current cycle of the input wave for sensing when the input wave exceeds a given amplitude in a given polarity;
(B) integrator means responsive to said threshold sensing means during said current cycle of the input wave for
  (1) starting to integrate the amplitudes of the current cycle of the input wave when the amplitude of the input wave exceeds said given amplitude in a given polarity, said integration thereby starting from a predetermined integrator means reset value, and
  (2) continuing to integrate the amplitudes of the current cycle of the input wave for a first given period of time which is less than the shortest expected input wave period and during said first period of time ignoring the value of the integral until at least it departs from said predetermined integrator means reset value;
(C) comparator means for comparing the value of the integral with said predetermined integrator means reset value during said current cycle of the input wave;
(D) said integrator means continuing to integrate the amplitudes of the current cycle of the input wave during said current cycle of the input wave for a second period of time until said comparator means determines that the value of the integral is insubstantially different from said predetermined integrator means reset value;

(E) whereby the period of repetition of system actions (A) through (D) is synchronized with the period of the fundamental frequency of the current cycle of the input wave, said period of repetition being the detected period of the fundamental frequency of the input wave.

95. A system for detecting the fundamental frequency of each cycle of a series of cycles of an alternating current input wave from an alternating current source, wherein each sequential cycle in the series is treated in what follows as the current cycle, and the following contiguous cycle is treated as the succeeding cycle, comprising:

(A) threshold sensing means responsive to the beginning of a current cycle of the input wave for sensing when the input wave exceeds a given amplitude in a given polarity;

(B) integrator means responsive to said threshold sensing means during said current cycle of the input wave for
  (1) starting to integrate the amplitudes of the current cycle of the input wave when the amplitude of the input wave exceeds said given amplitude in a given polarity, said integration thereby starting from a predetermined integrator means reset value, and
  (2) continuing to integrate the amplitudes of the current cycle of the input wave for a first given period of time which is less than the shortest expected input wave period and during said first period of time ignoring the value of the integral until at least it departs from said predetermined integrator means reset value;

(C) comparator means for comparing the value of the integral with a reference value above the highest expected end of cycle value of the integral;

(D) said integrator means continuing to integrate the amplitudes of the current cycle of the input wave during said current cycle of the input wave for a second period of time until said comparator means determines that the value of the integral is substantially different from said reference value;

(E) whereby the period of repetition of system actions (A) through (D) is synchronized with the period of the fundamental frequency of the current cycle of the input wave, said period of repetition being the detected period of the fundamental frequency of the input wave.

* * * * *